(12) United States Patent
Hanson et al.

(10) Patent No.: US 10,991,517 B2
(45) Date of Patent: Apr. 27, 2021

(54) MOLECULAR PHOTON UPCONVERSION USING ORGANIC-INORGANIC HYBRID INTERFACES

(71) Applicant: The Florida State University Research Foundation, Inc., Tallahassee, FL (US)

(72) Inventors: Kenneth Hanson, Tallahassee, FL (US); Sean Hill, Tallahassee, FL (US); Tristan Dilbeck, Tallahassee, FL (US)

(73) Assignee: The Florida State University Research Foundation, Inc., Tallahasse, FL (US)

( * ) Notice: Subject to any disclaimer, the term of this patent is extended or adjusted under 35 U.S.C. 154(b) by 175 days.

(21) Appl. No.: 15/502,448

(22) PCT Filed: Aug. 25, 2015

(86) PCT No.: PCT/US2015/046697
§ 371 (c)(1),
(2) Date: Feb. 7, 2017

(87) PCT Pub. No.: WO2016/039976
PCT Pub. Date: Mar. 17, 2016

(65) Prior Publication Data
US 2017/0236653 A1 Aug. 17, 2017

Related U.S. Application Data

(60) Provisional application No. 62/047,865, filed on Sep. 9, 2014.

(51) Int. Cl.
*H01G 9/20* (2006.01)
*H01L 51/00* (2006.01)

(52) U.S. Cl.
CPC ......... *H01G 9/2036* (2013.01); *H01G 9/2018* (2013.01); *H01G 9/2027* (2013.01);
(Continued)

(58) Field of Classification Search
CPC .............. H01L 33/0087; H01G 9/2018; H01G 9/2027; H01G 9/2031; H01G 9/2036; H01G 9/2059
See application file for complete search history.

(56) References Cited

U.S. PATENT DOCUMENTS

2005/0093107 A1 5/2005 Bao et al.
2009/0004878 A1 1/2009 Ohnuma et al.
(Continued)

FOREIGN PATENT DOCUMENTS

EP 2067838 B1 6/2013
WO 2011146744 A1 11/2011
WO 2013142595 A1 9/2013

OTHER PUBLICATIONS

Tanya N. Singh-Rachford and Felix N. Castellano, "Triplet Sensitized Red-to-Blue Photon Upconversion", J. Phys. Chem. Lett. 2010, 1, 195-200 (Year: 2009).*
(Continued)

*Primary Examiner* — Mayla Gonzalez Ramos
(74) *Attorney, Agent, or Firm* — Armstrong Teasdale LLP

(57) ABSTRACT

Transmission of low energy light is one of the primary loss mechanisms of a single junction solar cell. Molecular photon upconversion via triplet-triplet annihilation (TTA-UC)—combining two or more low energy photons to generate a higher energy excited state—is an intriguing strategy to surpass this limit. The present disclosure is directed to self-assembled multilayers, e.g., bi- or trilayers, on metal oxide surfaces as a strategy to facilitate TTA-UC emission and demonstrate direct charge separation of the upconverted (Continued)

state. A three-fold enhancement in transient photocurrent is achieved at light intensities as low as two equivalent suns. The multilayer structure comprises a substrate comprising a metal oxide surface and a bulk region, and a self-assembled bilayer film, the bilayer film comprising: (a) an acceptor molecule covalently bonded to the metal oxide surface; (b) a linking metal ion bonded to the acceptor molecule; and (c) one or more sensitizer molecule(s) bonded to the linking coordinating metal ion.

17 Claims, 15 Drawing Sheets

(52) U.S. Cl.
CPC .......... *H01G 9/2031* (2013.01); *H01G 9/2059* (2013.01); *H01L 51/0052* (2013.01); *H01L 51/0087* (2013.01); *H01L 51/009* (2013.01); *H01L 51/0092* (2013.01); *Y02E 10/52* (2013.01); *Y02E 10/542* (2013.01); *Y02E 10/549* (2013.01)

(56) References Cited

U.S. PATENT DOCUMENTS

| | | |
|---|---|---|
| 2009/0179269 A1 | 7/2009 | Hook et al. |
| 2010/0244677 A1 | 9/2010 | Begley et al. |
| 2015/0075621 A1* | 3/2015 | Hanson ................ H01G 9/2059 136/263 |

OTHER PUBLICATIONS

Victor Gray, Damir Dzebo, Maria Abrahamsson, Bo Albinsson and Kasper Moth-Poulsen, "Triplet-triplet annihilation photon-upconversion: towards solar energy applications", Phys.Chem.Chem. Phys., 2014, 16, 10345 (Year: 2014).*

Jonas Sandby Lissau, James M. Gardner, and Ana Morandeira, Photon Upconversion on Dye-Sensitized Nanostructured ZrO2 Films, 2011, J. Phys. Chem. C 2011, 115, 23226-23232 (Year: 2011).*

Jonas Sandby Lissau, Djawed Nauroozi, Marie-Pierre Santoni, Sascha Ott, James M. Gardner, and Ana Morandeira, Anchoring Energy Acceptors to Nanostructured ZrO2 Enhances Photon Upconversion by Sensitized Triplet-Triplet Annihilation Under Simulated Solar Flux, 2013, J. Phys. Chem. C 2013, 117,14493-145 (Year: 2013).*

International Search Report and Written Opinion of the International Searching Authority based on PCT/US2015/046697 dated Dec. 7, 2015, 12 pgs.

U.S. Appl. No. 62/047,865, filed Sep. 9, 2014.

Bettis, Stephanie E. et al., Photophysical Characterization of a Chromophore/Water Oxidation Catalyst Containing a Layer-by-Layer Assembly on Nanocrystalline TiO2 Using Ultrafast Spectroscopy, The Journal of Physical Chemistry, 2014, vol. 118, pp. 10301-10308.

Hanss, David et al., Importance of covalence, conformational effects and tunneling-barrier heights for long-range electron transfer: Insights from dyads with oligo-p-phenylene, oligo-p-xylene and oligo-p-dimethoxybenzene bridges, Coordination Chemistry Reviews, 2010, vol. 254, pp. 2584-2592 Elsevier B.V.

Wang, James C. et al., Modulating Electron Transfer Dynamics at Dye-Semiconductor Interfaces via Self-Assembled Bilayers, Journal of Physical Chemstry, 2015, vol. 119, pp. 3502-3508, ACS Publications.

Khare, Ayush; A critical review on the efficiency improvement of upconversion assisted solar cells, Journal of Alloys and Compounds, 2020, vol. 821, No. 15321, pp. 1-31.

Pedrini, Jacopo et. al.; Recent advances in the application triplet-triplet annihilation-based photon upconversion systems to solar technologies, Journal of Photonics for Energy, 2017, vol. 8, No. 2, pp. 022005-1-022005-16.

Gray, Victor et al., Towards efficient solid-state triplet-triplet annihilation based photon upconversion: Supramolecular, macromolecular and self-assembled systems, Coordination Chemistry Reviews, 2018, vol. 362, pp. 54-71.

Zhou, Yan et al., Singlet Sensitization-Enhanced Upconversion Solar Cells via Self-Assembled Trilayers, ACS Energy Letters, 2019, vol. 4, pp. 1458-1463.

Morifuji, Tatsuro et al., Integrated Photon Upconversion Dey-Sensitized Solar Cell by Co-adsorption with Derivative of Pt-Porphyrin and Anthracene on Mesoporous TiO2, ACS Omega, 2019, vol. 4, pp. 11271-11275.

Beery, Drake et al., CdSe Quantum Dot Sensitized Molecular Photon Upconversion Solar Cells, ACS Applied Energy Materials, 2020, vol. 3, pp. 29-37.

Ahmad, Shargeel et al., Photon Up-Conversion via Epitaxial Surface-Supported Metal-Organic Framework Thin Fims with Enhanced Photocurrent, ACS Applied Energy Materials, 2018, vol. 1, pp. 249-253.

Hill, Sean P. et al., Harnessing Molecular Photon Upconversion in a Solar cell at Sub-solar Irradiance: Rose of the Redox Meditor, Journal of the American Chemical Society, 2017, vol. 139, pp. 10988-10991.

Lin L. Yunhui et al., Enhanced sub-bandgap efficiency of a solid-state organic intermediate band solar cell using triplet-triplet annihilation, Energy & Environmental Science, 2017, vol. 10, pp. 1465-1475.

Dilbeck, Tristan et al., Harnessing Molecular Photon Upconversion at Sub-Solar Irradiance Using Dual Sensitized Self-Assembled Trilayers, Journal of Materials Chemistry, 2017, pp. S1-S9.

Moguzzi, Angelo et al., Efficient Broadband Triplet-Triplet Annihilation-Assisted Photon Upconversion at Subsolar Irradiance in Fully Organic Systems, Materials Views, 2015, vol. 25, pp. 5617-5624.

Simpson, Catherine et al., An Intermediate Band Dye-sensitised Solar Cell Using Triplet-Triplet Annihilation, Physical Chemistry Chemical Physics, 2013. vol. 00, pp. 1-7.

Cheng, Yuen Yap et al., Increased upconversion performance for thin film solar cells: a trimolecular composition, Chemical Science, 2016, vol. 7, pp. 559-568.

Hill, Sean P. et al., Integrated Photon Upconversion Solar Cell via Molecular Self-Assembled Bilayers, ACS Energy Letters, 2016, vol. 1, pp. 3-8.

Schulze, Tim F. et al., Efficiency Enhancement of Organic and Think-Film Silicon Solar Cells with Photochemical Upconversion, The Journal of Physical Chemistry, 2012, vol. 116, pp. 22794-22801.

Schulze, Tim F. et al., Photochemical Upconversion Enhanced Solar Cells: Effect of a Back Reflector, Aust. Journal. Chemistry, 2012, vol. 65, pp. 480-485.

Cheng, Yuen Yap et al., Improving the light-harvesting of amorphous silicon solar cells with photochemical upconversion, pp. 1-17.

* cited by examiner

MOLECULAR PHOTON UPCONVERSION USING ORGANIC-INORGANIC HYBRID INTERFACES

CROSS REFERENCE TO RELATED APPLICATION(S)

This application is a U.S. national stage application based on International Application No. PCT/US2015/046697, which was filed Aug. 26, 2015 and has published as International Publication No. WO 2016/039976. International Application No. PCT/US2015/0439976 claims priority to U.S. Provisional Application Ser. No. 62/047,865, which was filed Sep. 9, 2014. Both priority applications are hereby incorporated by reference as if set forth in their entirety.

FIELD OF THE INVENTION

The present invention generally relates to structures comprising self-assembled bilayers, and more specifically to self-assembled multilayers, e.g., bilayers or trilayers, comprising an emissive ("acceptor") molecule, a metal ion, and one or more sensitizer ("donor") molecules. The self-assembled multilayers, e.g., bilayers or trilayers, of the present invention may facilitate and harness photon upconversion.

BACKGROUND OF THE INVENTION

The abundant and sustained nature of solar energy leaves little doubt that solar cell technology will play a pivotal role in future clean energy strategies. It is for this reason that considerable research efforts are dedicated to increasing solar cell efficiencies in order to decrease module costs (cost/W). Due to fundamental physical limitations, a standard, single-junction solar cell has a maximum theoretical efficiency of ~34% (under standard AM1.5 solar irradiation) as initially outlined by Shockley and Queisser. See Shockley, W. & Queisser, H. J. Detailed Balance Limit of Efficiency of pn Junction Solar Cells. *J. Appl. Phys.* 32, 510 (1960). Transmission (i.e., lack of absorption) of low energy, sub-bandgap light is one of the primary loss mechanisms responsible for solar cell efficiencies being much less than 100%. Combining two low energy photons to generate a higher energy excited state, also known as photon upconversion (UC), is an intriguing strategy to circumvent the Shockley-Queisser limit. Theoretical models predict that efficiencies upwards of 43% (under AM1.5) and >50% (with solar concentrators) can be achieved if UC is utilized to harness sub-bandgap portions of the solar spectrum. See Schmidt, T. W. & Tayebjee, M. J. Y. in *Comprehensive Renewable Energy*, vol. 1, 533-548 (2012).

Photon upconversion is a photophysical process where the energy from two or more lower frequency photons are combined to generate a single, higher frequency photon. Interest in upconversion continues to grow because it offers a mechanism to harvest lower energy light for applications including photodynamic therapy, solar energy conversion, and in photoactuators. See J. Am. Chem. Soc., 2007, 129 (15), pp 4526-4527; Optics Express, Vol. 17, Issue 1, pp. 80-86 (2009), http://dx.doi.org/10.1364/OE.17.000080; J. Phys. Chem. Lett., 2013, 4 (12), pp 2073-2078 http://pubs.acs.org/doi/abs/10.1021/jz401050u; Nanoscale Res Lett. 2013; 8(1): 81. http://www.ncbi.nlm.nih.gov/pmc/articles/PMC3605184/; and J. Am. Chem. Soc., 2011, 133 (40), pp 15810-15813, http://pubs.acs.org/doi/abs/10.1021/ja2043276.

There are two types of materials that can be used to facilitate photon upconversion, 1) inorganic solids, and 2) small molecules. For the inorganic solids, lanthanide-doped crystals are known to exhibit efficient photon upconversion under high intensity irradiation (>500 mW). See Angew Chemie, 2011, 50 (26) 5808-5829. http://onlinelibrary.wiley.com/doi/10.1002/anie.201005159/abstract. However, these inorganic systems are not ideal for many applications where high intensity light can be either destructive (biological systems) or unavailable without concentrator technology (solar energy conversion).

The alternative strategy, molecular upconversion, requires a pair of molecules that are often labeled as a sensitizer (or donor) and an emitter (or acceptor) molecule. FIG. 1 is a depiction of the molecular upconversion process, also known as triplet-triplet annihilation ("TTA"). In this scheme and with reference to FIG. 1, lower energy light is absorbed by the sensitizer molecule to generate a singlet excited state that quickly undergoes intersystem crossing to produce a triplet excited state. In the presence of an acceptor molecule, with a lower energy triplet state, the sensitizer-acceptor pair will undergo energy transfer to generate an acceptor molecule in the triplet excited state. Repeating this process with the same or a different sensitizer molecule will result in the generation of several acceptor molecules in the triplet excited state. Then, when two acceptor molecules in the triplet excited state are in proximity, either through energy transfer or diffusion, the pair will undergo TTA where one of the acceptors relaxes down to the ground state and the other acceptor is further excited into the singlet excited state. The acceptor in the singlet excited state can then radiatively relax to the ground state and produce a higher energy photon. In total, two photons of lower energy (up arrows in FIG. 1) are converted into one photon of higher energy (down arrow in FIG. 1).

The medium/method used to bring the sensitizer and acceptor molecules into proximity is crucial to not only generating upcoversion but also the efficiency of the process. By far the most common method is in solution where the molecules are free to diffuse through the medium. See Coord. Chem. Rev., 2010, 254, (21-22), 2560-2573. http://www.sciencedirect.com/science/article/pii/S00108545100-00093#; New J. Phys., 2008, 10, 1-12. http://iopscience.iop.org/1367-2630/10/1/013007. Incorporation of the upconversion molecules into a polymer chain or matrix has also been shown to be effective. See J. Phys. Chem. Lett., 2013, 4, (23), 4113-4118. http://pubs.acs.org/doi/abs/10.1021/jz402311j, and J Luminescence, 2009, 129, (3), 303-306. http://www.sciencedirect.com/science/article/pii/S0022231308002937. Additional strategies include using a liquid acceptor molecule as the neat solvent with small amounts of sensitizer added or encompassing an upconversion pair within a micelle-structured microemulsion. See J. Am. Chem. Soc., 2013, 135, (51), 19056-19059. http://pubs.acs.org/doi/abs/10.1021/ja411316s, and Photochem. Photobiol. Sci., 2014, 13, 48-61. http://pubs.rsc.org/en/content/articlehtml/2013/pp/c3pp50318f.

One strategy by Morandeira and coworkers involves upconversion pairs and metal oxide surfaces. In their first report, they non-covalently precipitate a sensitizer, platinum octaethylporpyrin (PtOEP), and acceptor, diphenylanthracene (DPA) onto a $ZrO_2$ nanocrystalline electrode. See J. Phys. Chem., 2011 115, (46), 23226-23232. http://pubs.acs.org/doi/abs/10.1021/jp209774p. Steady-state and quantum yield measurements indicate that up-conversion does occur but is relatively inefficient in this system ($\Phi=6\times 10^{-4}$%). In a follow-up report the acceptor molecule, carboxylated diphenylanthracene, was covalently bound to nanocrystalline $ZrO_2$ and the sensitizer, PtOEP, was dissolved in solution. See J. Phys. Chem., 2013, 117 (28), pp 14493-14501. http://pubs.acs.org/doi/abs/10.1021/jp402477q. This strategy increases the upconversion efficiency ($\Phi$=0.04%) but is still limited in that it requires sensitizer diffusion to the metal oxide surface which is in competition with radiative and non-radiative decay.

Stepwise assembly of bilayers on a surface has been successfully implemented with choromophore-catalyst and chromophore-chromophore assemblies. See, e.g., Hanson, K.; Torelli, D. A.; Vannucci, A. K.; Brennaman, M. K.; Luo, H.; Alibabaei, L.; Song, W.; Ashford, D. L.; Norris, M. R.; Glasson, C. R. K.; Concepcion, J. J.; Meyer, T. J. *Angewandte Chemie International Edition* 2012, 51, 12782; Bettis, S. E.; Hanson, K.; Wang, L.; Gish, M. K.; Concepcion, J. J.; Fang, Z.; Meyer, T. J.; Papanikolas, J. M. *The Journal of Physical Chemistry A* 2014; Nayak, A.; Knauf, R. R.; Hanson, K.; Alibabaei, L.; Concepcion, J. J.; Ashford, D. L.; Dempsey, J. L.; Meyer, T. J. *Chemical Science* 2014; and Ding, X.; Gao, Y.; Zhang, L.; Yu, Z.; Liu, J.; Sun, L. *ACS Catalysis* 2014, 2347.

SUMMARY OF THE INVENTION

Among the provisions of the present invention may be noted a multilayer structure comprising: a substrate comprising a metal oxide surface and a bulk region; a self-assembled bilayer film, the bilayer film comprising: (a) an acceptor molecule covalently bonded to the metal oxide surface; (b) a linking coordinating metal ion bonded to the acceptor molecule; and (c) a sensitizer molecule bonded to the linking coordinating metal ion.

Other objects and features will be in part apparent and in part pointed out hereinafter.

BRIEF DESCRIPTION OF THE DRAWING(S)

Figure 13A:
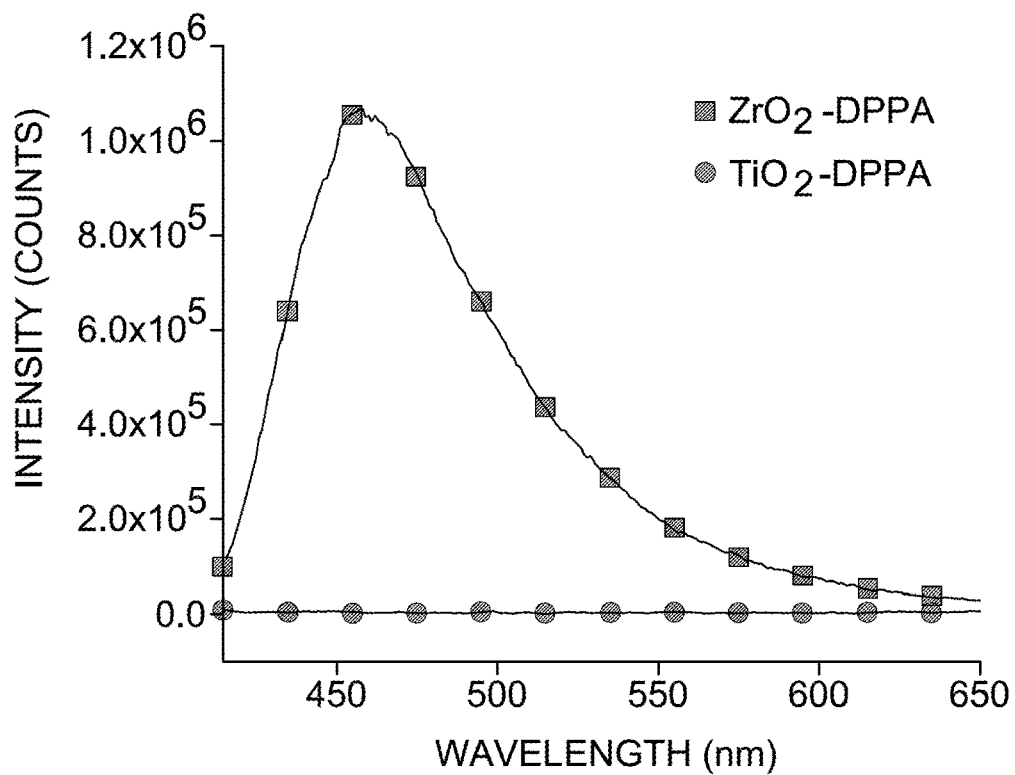
Figure 13B:
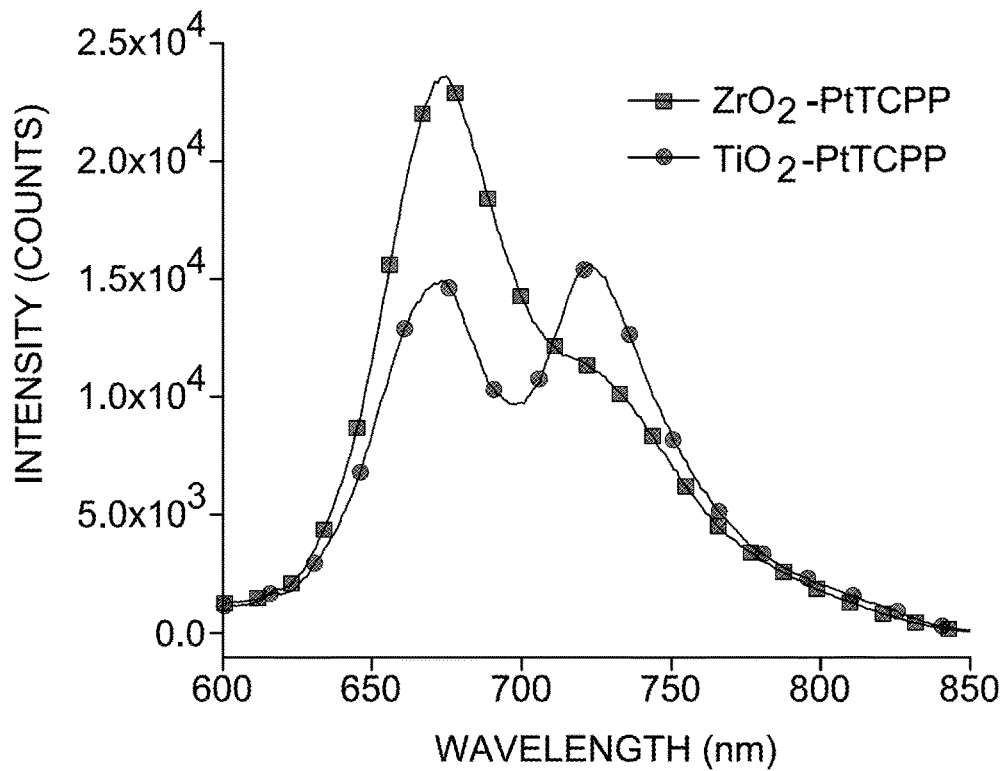
Figure 13C:
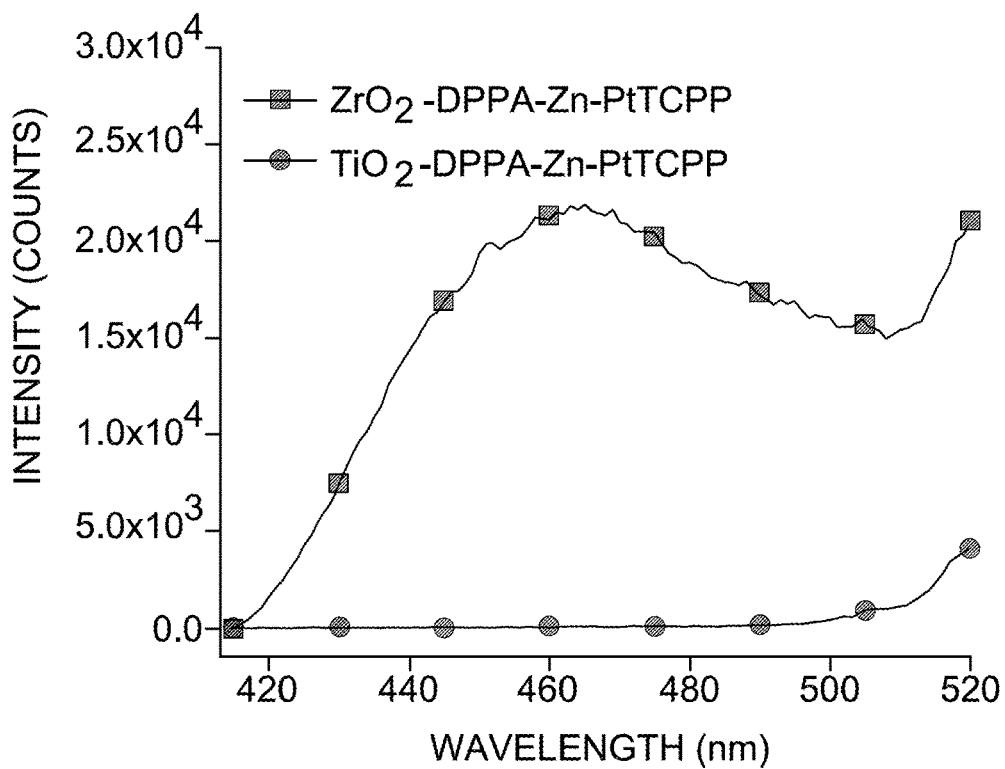
Figure 13D:
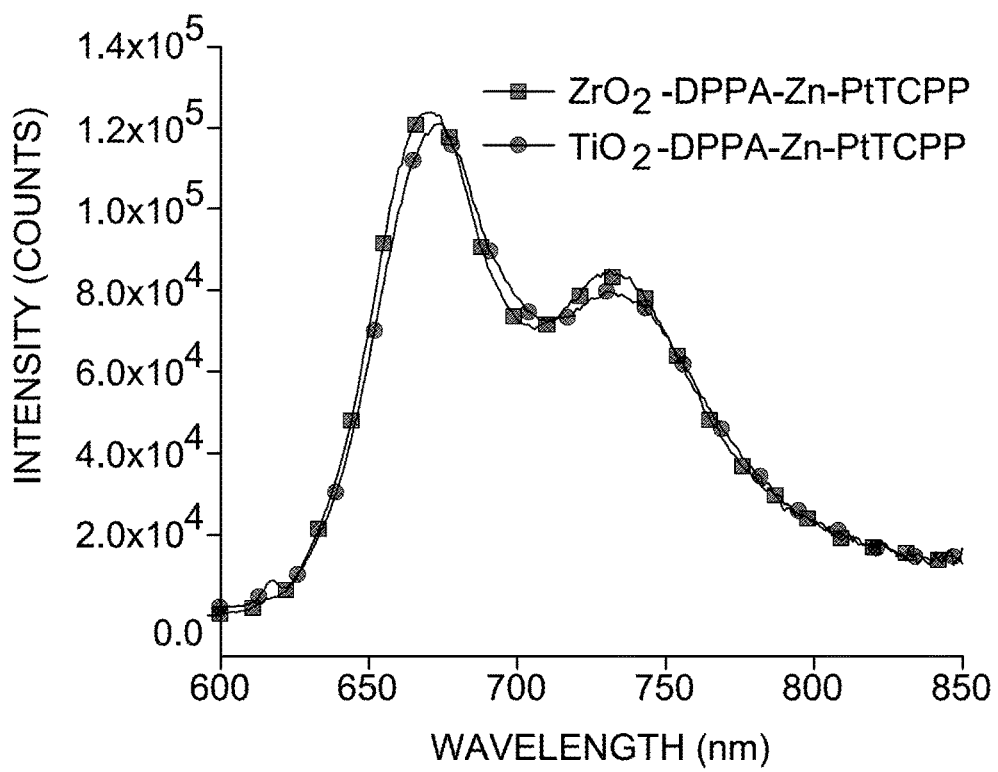

FIGS. 13A, 13B, 13C, and 13D are graphs depicting relative emission intensities on $TiO_2$ and $ZrO_2$. FIG. 13A is emission spectrum for a $ZrO_2$-DPPA and $TiO_2$-DPPA ($\lambda_{ex}$=400 nm). FIG. 13B is emission spectrum for $ZrO_2$—PtTCPP and $TiO_2$—PtTCPP ($\lambda_{ex}$=532 nm, uncorrected spectra). FIG. 13C is emission spectrum for $ZrO_2$-DPPA-Zn-PtTCPP. FIG. 13D is emission spectrum for $TiO_2$-DPPA-Zn—PtTCPP. ($\lambda_{ex}$=532 nm).

Figure 14:
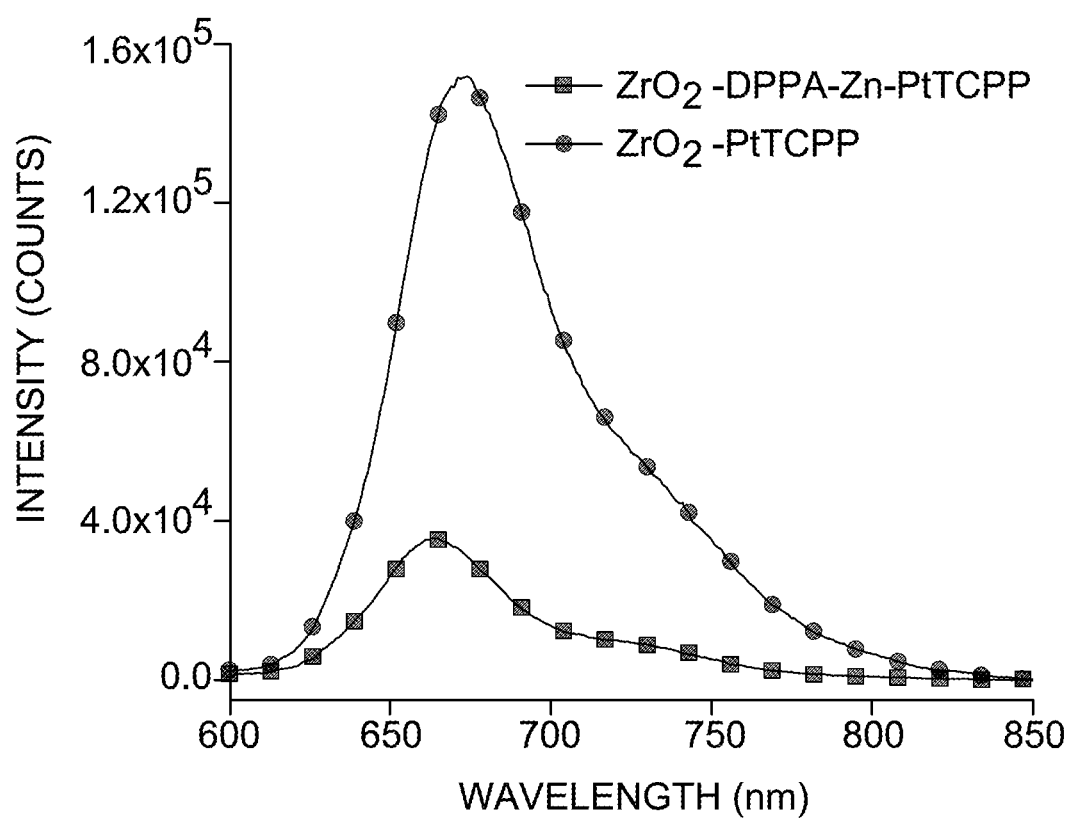

FIG. 14 are uncorrected emission spectra for $ZrO_2$—PtTCPP and $ZrO_2$-DPPA-Zn—PtTCPP films under 532 nm laser excitation (2.5 W/cm$^2$).

Figure 15:
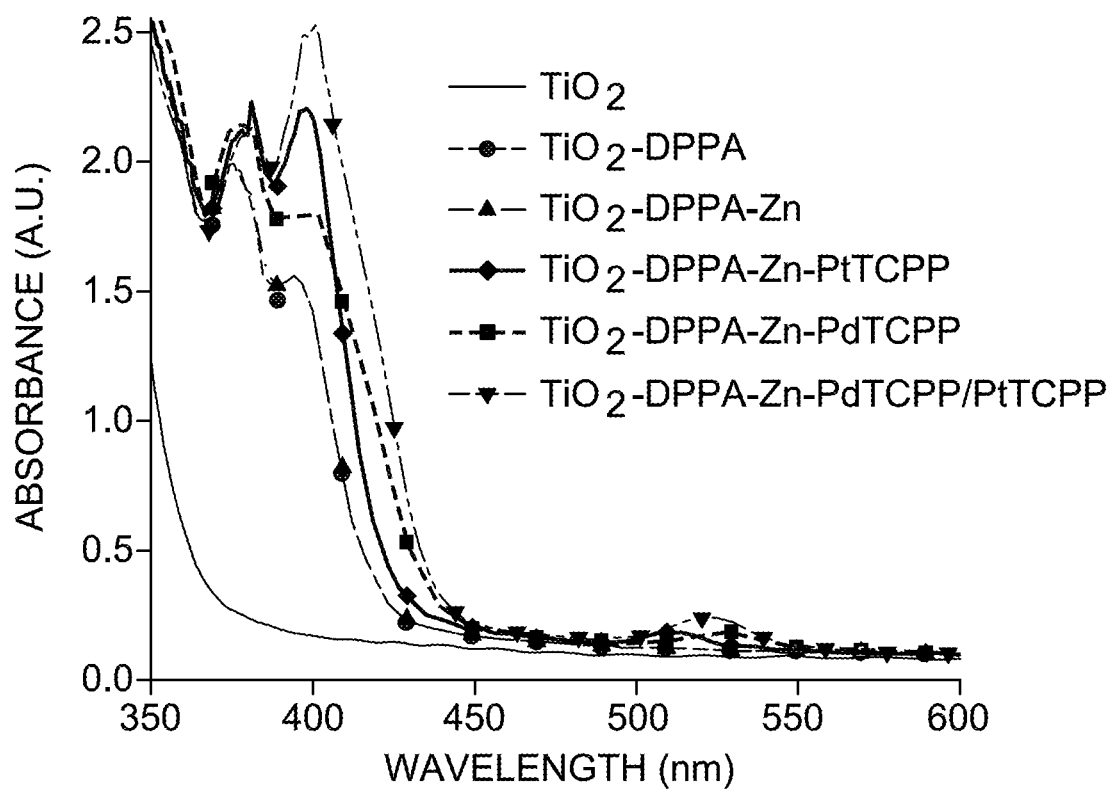

FIG. 15 are absorption spectra for $TiO_2$, $TiO_2$-DPPA, $TiO_2$-DPPA-Zn—PtTCPP, $TiO_2$-DPPA-Zn—PdTCPP and $TiO_2$-DPPA-Zn—PtTCPP/PdTCPP.

Figure 16:
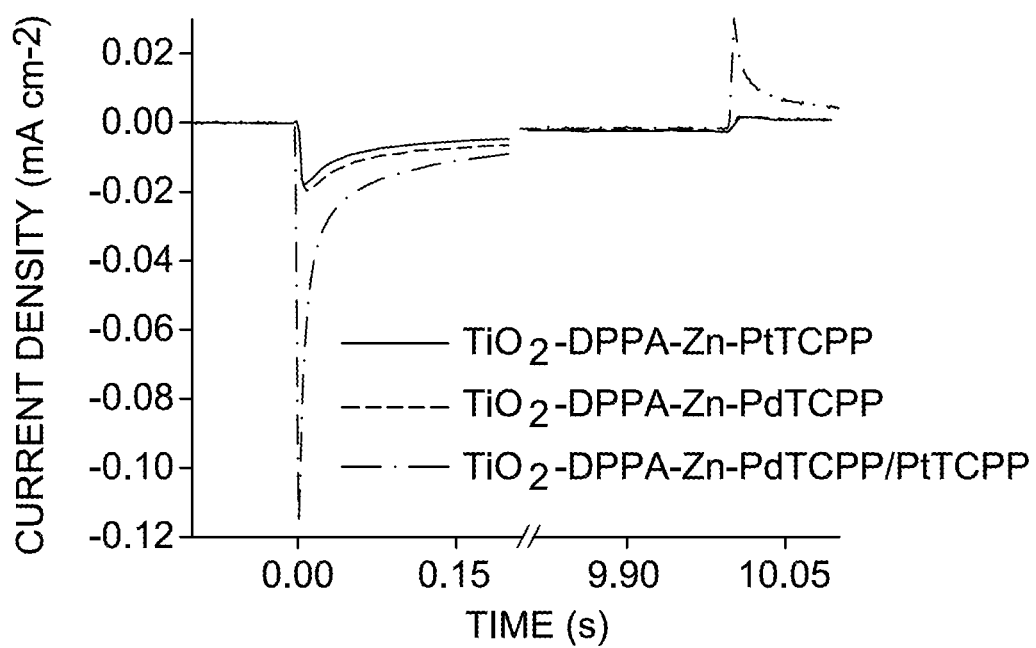

FIG. 16 are amperometric i-t curves for $TiO_2$-DPPA-Zn—PtTCPP, $TiO_2$-DPPA-Zn—PdTCPP and $TiO_2$-DPPA-Zn—PtTCPP/PdTCPP under two equivalent AM1.5 solar irradiation passing through a 475 nm long-pass filter (shutter open at 0 s, closed at 10 s)

Figure 17:
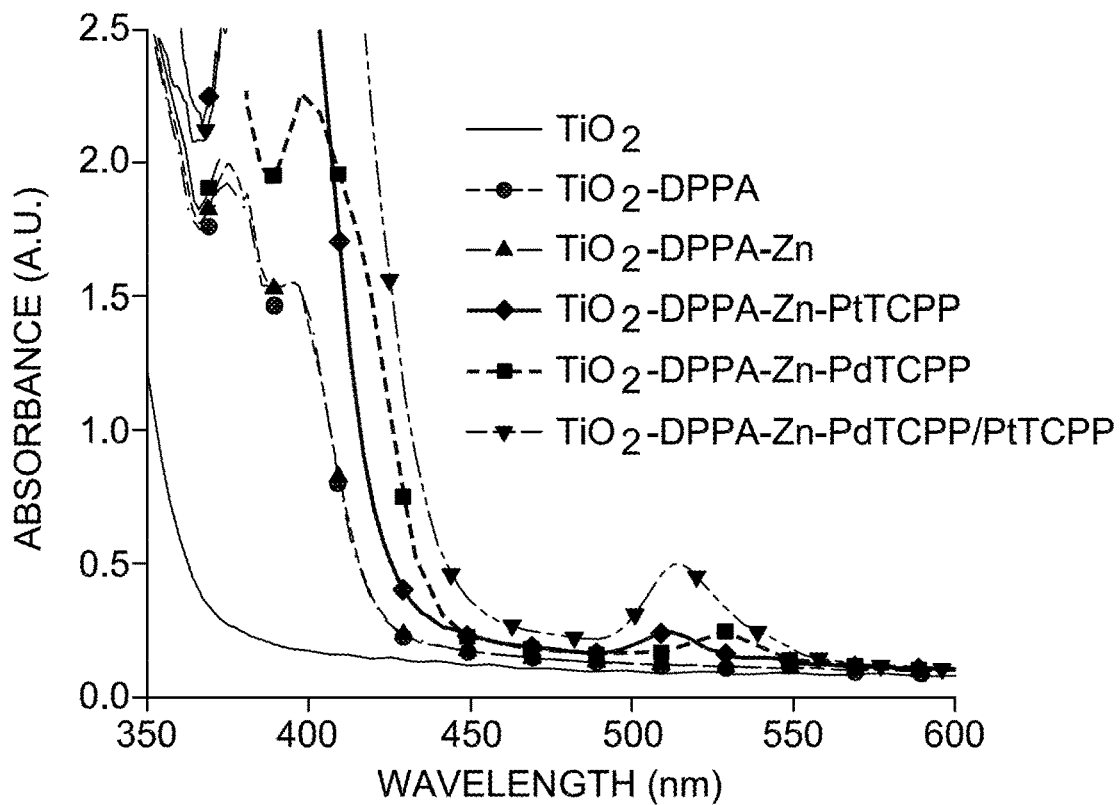

FIG. 17 are absorption spectra for $TiO_2$, $TiO_2$-DPPA, $TiO_2$-DPPA-Zn, $TiO_2$-DPPA-Zn—PtTCPP, $TiO_2$-DPPA-Zn—PdTCPP and $TiO_2$-DPPA-Zn—PtTCPP-Zn—PdTCPP.

Figure 18:
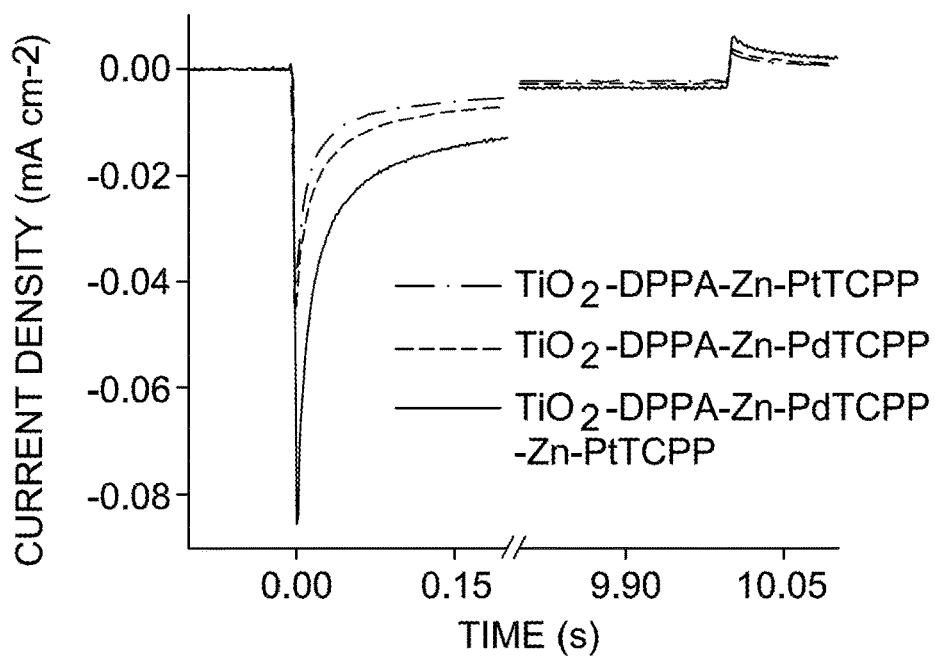

FIG. 18 are amperometric i-t curves for $TiO_2$-DPPA-Zn—PtTCPP, $TiO_2$-DPPA-Zn—PdTCPP and $TiO_2$-DPPA-Zn—PdTCPP-Zn-PtTCPP under two equivalent AM1.5 solar irradiation passing through a 475 nm long-pass filter (shutter open at 0 s, closed at 10 s)

DETAILED DESCRIPTION OF THE EMBODIMENT(S) OF THE INVENTION

The present invention is directed to a structure capable of facilitating photon upconversion. In some embodiments, the present invention is directed to a self-assembled multilayer, e.g., a bilayer, a trilayer, or more, as a means of facilitating photon upconversion. See FIG. 2, which is an illustration of a self-assembled bilayer according to one embodiment of the invention. In some embodiments, the bilayer comprises an acceptor, a metal ion, and a sensitizer molecule on a metal oxide ($M_xO_y$) surface. In some embodiments, the multilayer, e.g., a bilayer, comprises an acceptor, a metal ion, and two or more sensitizer molecules on a metal oxide ($M_xO_y$) surface. In some embodiments, the multilayer, e.g., a bilayer, comprises an acceptor, a metal ion, and two or more sensitizer molecules on a metal oxide ($M_xO_y$) surface, in which the sensitizers are linked in parallel. In some embodiments, the multilayer comprises an acceptor, a metal ion, and two or more sensitizer molecules on a metal oxide ($M_xO_y$) surface, in which the sensitizers are linking in a series (e.g., in a trilayer film). The multilayer, e.g., a bilayer, film comprises an acceptor molecule covalently bonded to a metal oxide surface, a linking metal ion bonded to the acceptor molecule, and a sensitizer molecule, or more than one sensitizer, bonded to the linking metal ion. This approach offers a simple method to control the organization of two or more photoactive molecules on a metal oxide surfaces via metal ion linkages.

Figure 3A:
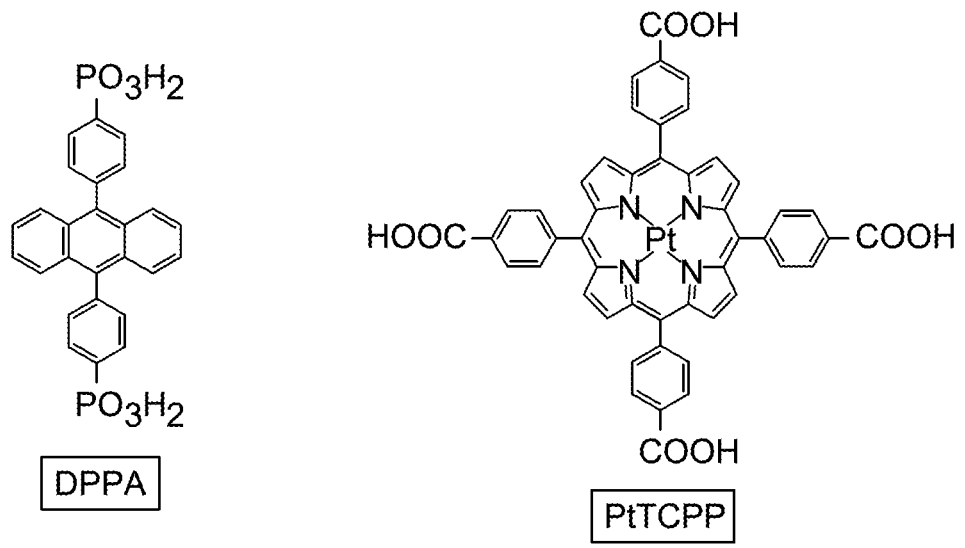
FIG. 3A is a depiction of the chemical structures of DPPA and PtTCPP, which are components of a multilayer film according to some embodiments of the present invention.
Figure 3B:
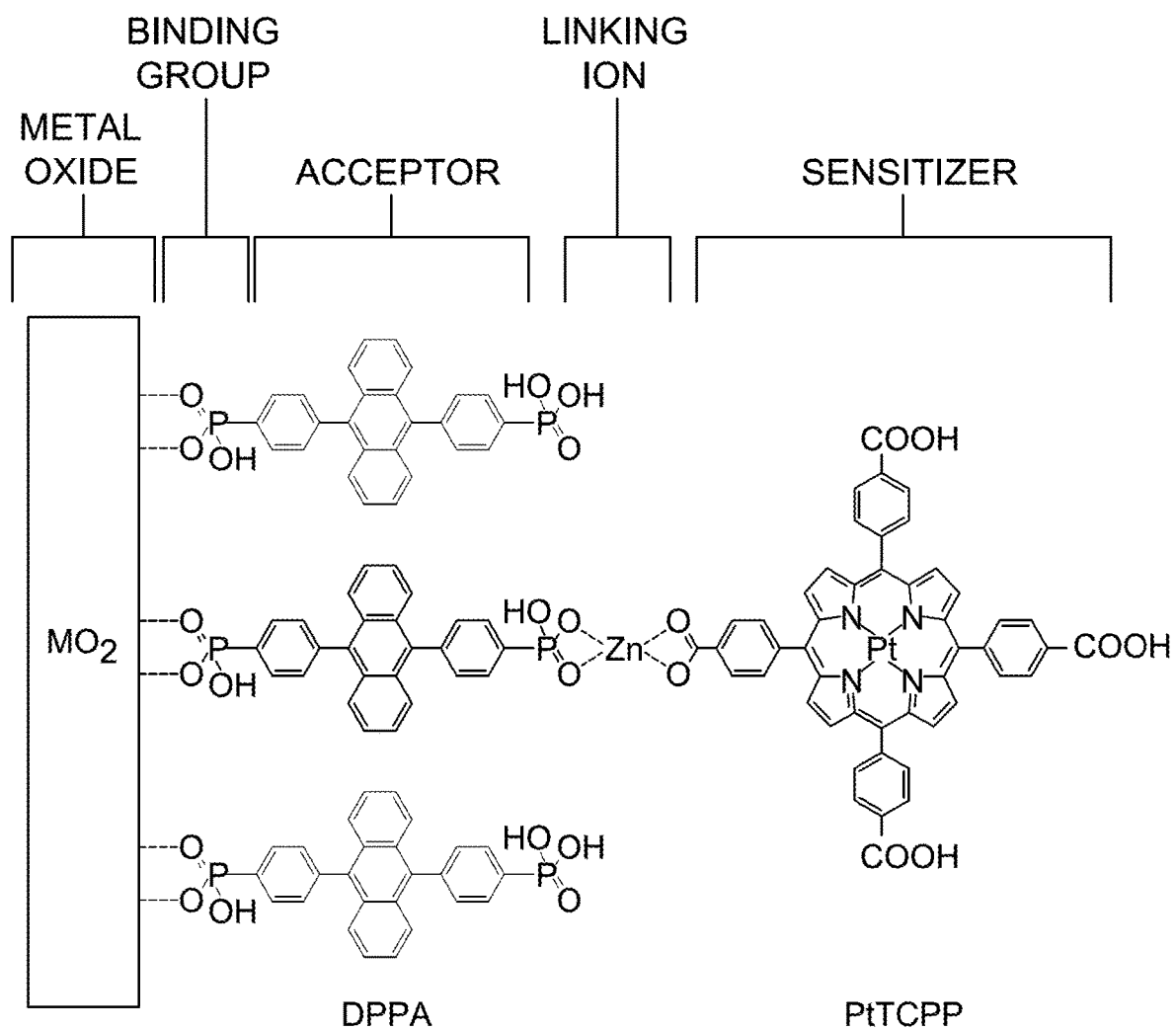
FIG. 3B is a schematic representation of a bilayer film on a metal oxide surface ($MO_2$-DPPA-Zn—PtTCPP) according to some embodiments of the present invention.
Figure 3C:
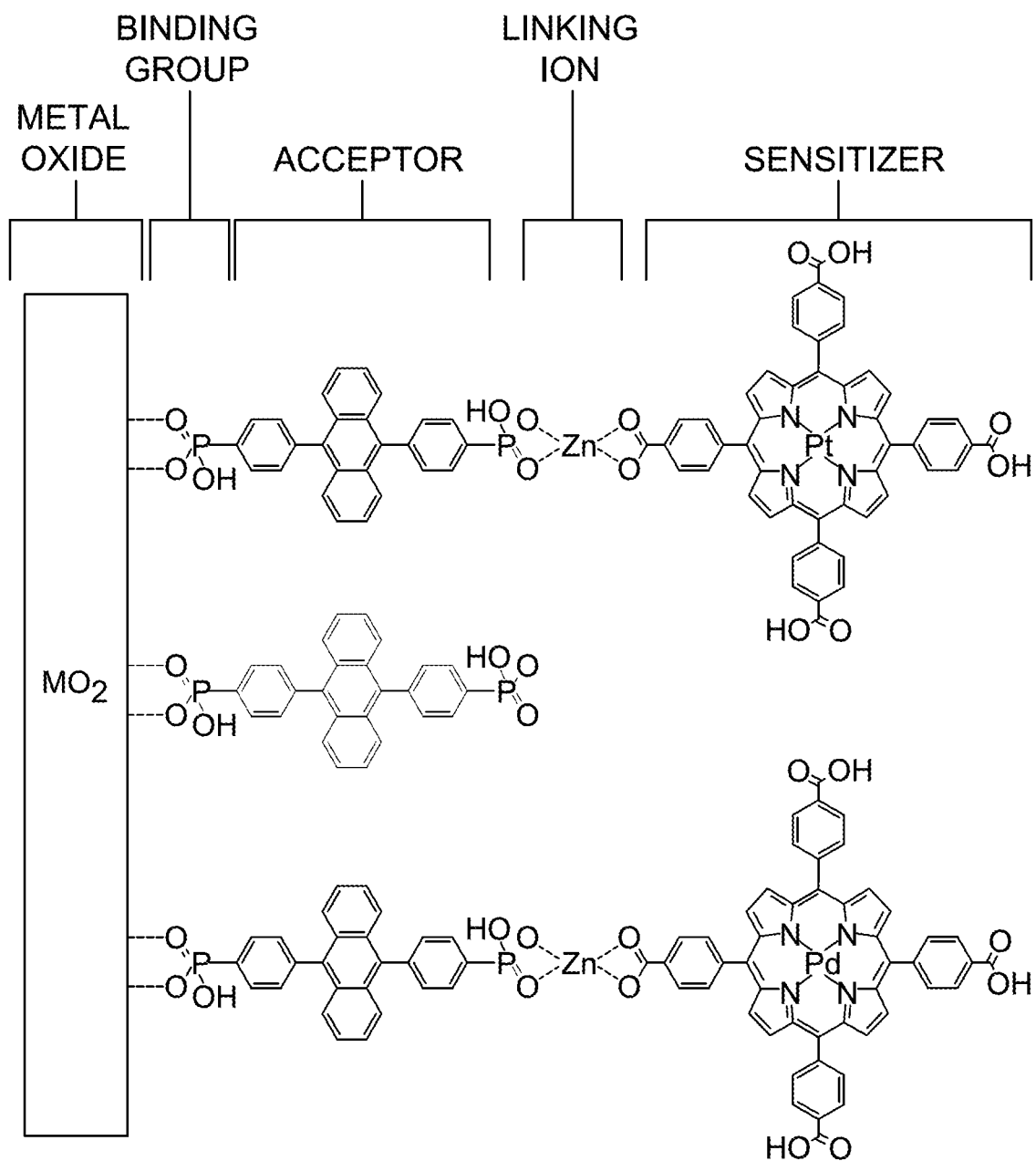
FIG. 3C is a schematic representation of a co-sensitized bilayer film on a metal oxide surface ($MO_2$-DPPA-Zn—PtTCPP/PdTCPP) according to some embodiments of the present invention.
Figure 3D:
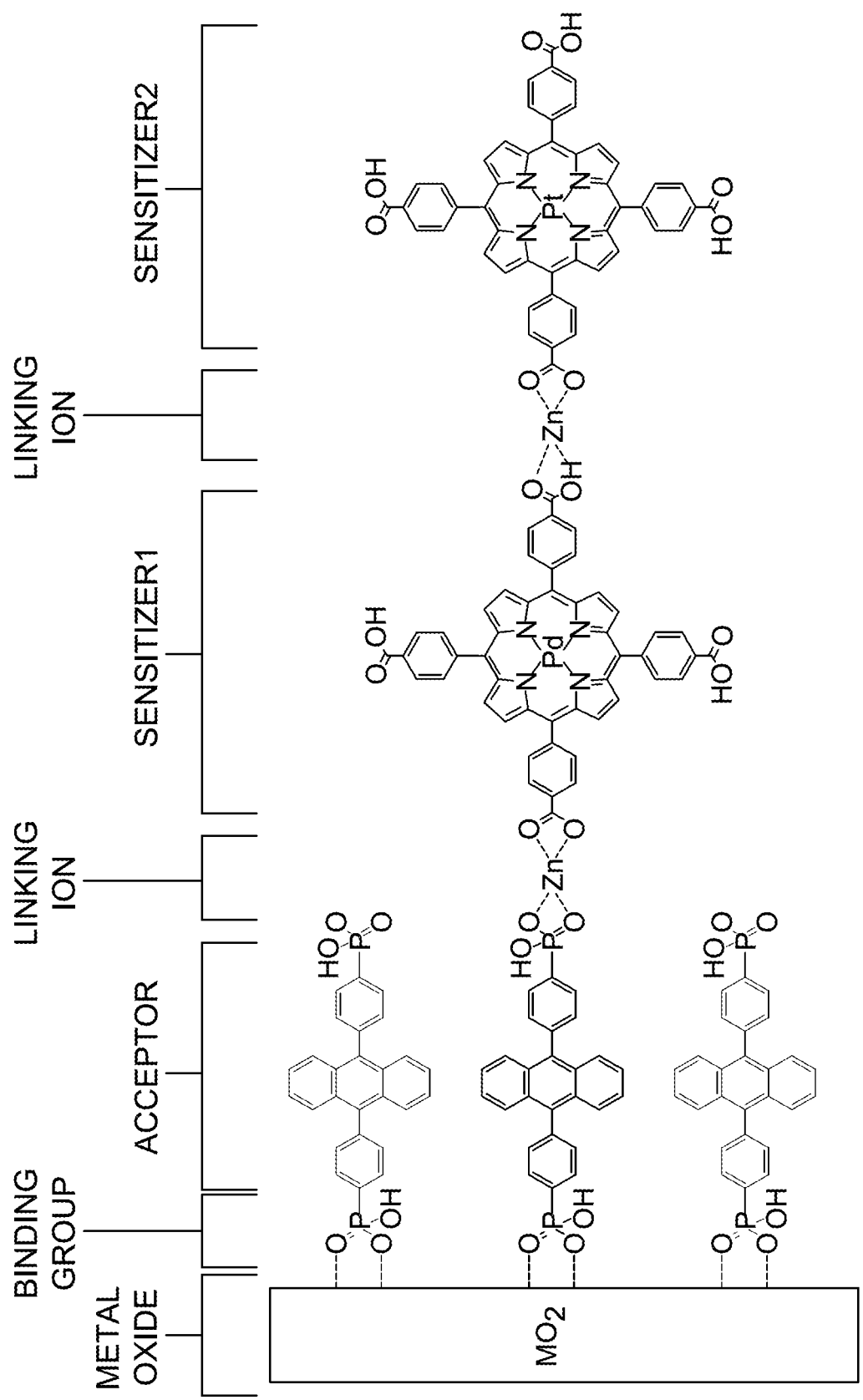
FIG. 3D is a schematic representation of a trilayer film on a metal oxide surface ($MO_2$-DPPA-Zn—PdTCPP-Zn-PtTCPP) according to some embodiments of the present invention.

According to some embodiments of the present invention, self-assembled multilayers, e.g., bilayers, of a TTA molecular pair are prepared on metal oxide surfaces, as a means of facilitating TTA-UC and charge separation of the upconverted state. An exemplary, non-limiting embodiment is depicted in FIGS. 3A and 3B and provides a simple method for multimolecular assembly on a metal oxide surface. The close proximity of sensitizer and acceptor molecules facilitate TTA-UC emission, and we demonstrate that direct photocurrent generation can be achieved at the acceptor-semiconductor interface. The bilayer film depicted in FIG. 3B is prepared by step-wise soaking of nanocrystalline $TiO_2$ or $ZrO_2$ films in three separate solutions of 4,4'-(anthracene-9,10-diyl)bis(4,1-phenylene)diphosphonic acid (DPPA), $Zn(CH_3COO)_2$ and Pt(II)tetrakis(4-carboxyphenyl)porphyrin (PtTCPP). Anthracene and platinum porphyrin derivatives were selected as the TTA-UC pair because they are known to exhibit efficient UC emission ($\Phi_{em}$, >20%). See Singh-Rachford, T. N. & Castellano, F. N. Photon upconversion based on sensitized triplet-triplet annihilation. *Coord. Chem. Rev.* 254, 2560-2573, doi:Doi 10.1016/J.Ccr.2010.01.003 (2010) and Gray, V., Dzebo, D., Abrahamsson, M., Albinsson, B. & Moth-Poulsen, K. Triplet-triplet annihilation photon-upconversion: towards solar energy applications. *Phys. Chem. Chem. Phys.* 16, 10345-10352, doi:Doi 10.1039/C4cp00744a (2014). FIGS. 3C and 3D depict additionally exemplary, nonlimiting embodiments of the invention comprising multiple sensitizers in bilayer or trilayer formations.

Figure 1:
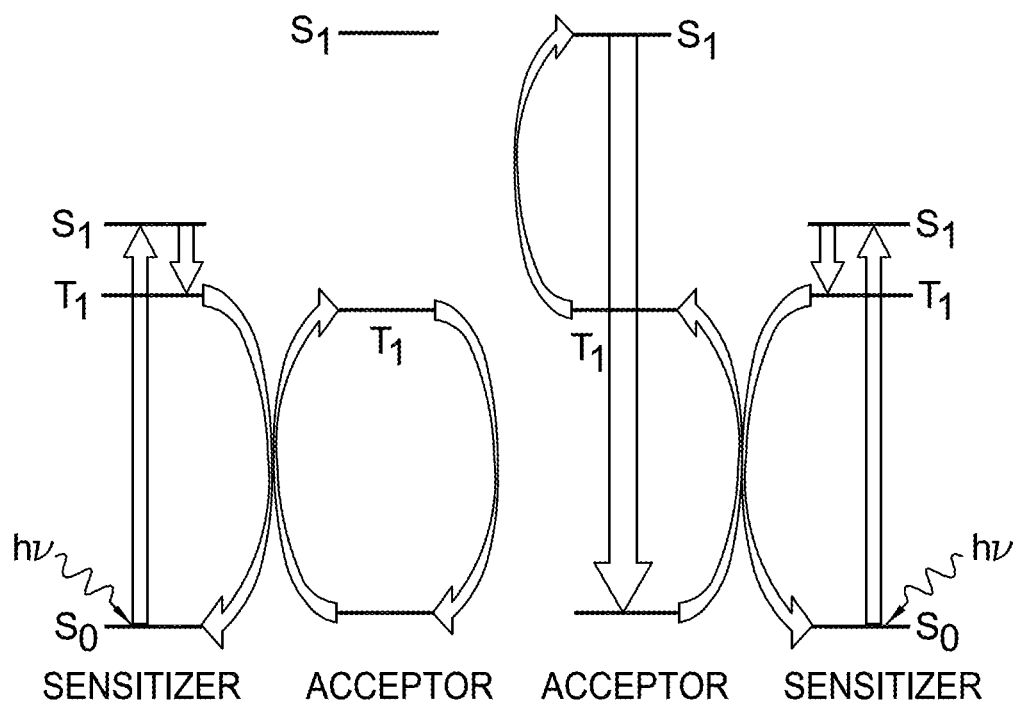
FIG. 1 is an energy level diagram depicting the absorption and energy transfer steps required for triplet-triplet annihilation ("TTA"). ($S_n$=singlet state and $T_n$=triplet state).
Figure 2:
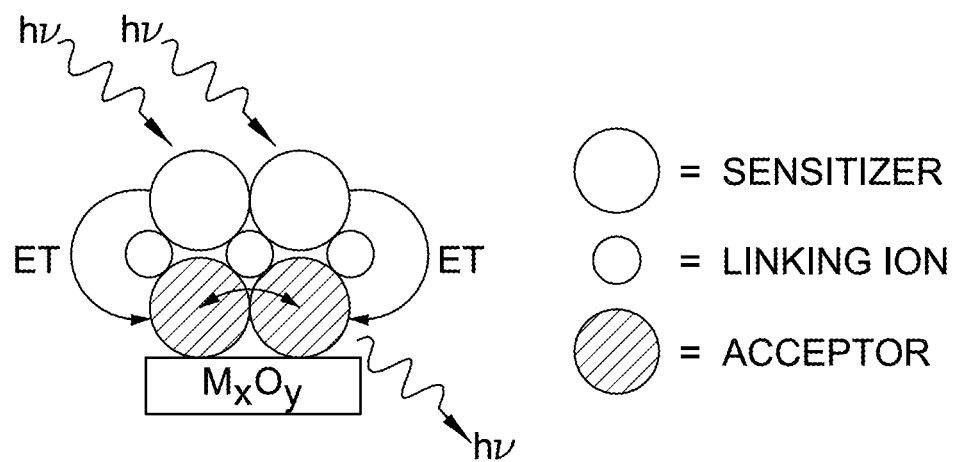
FIG. 2 is an illustration of a self-assembled bilayer according to one embodiment of the invention. The bilayer comprises an acceptor, a linking metal ion, and a sensitizer molecule on a metal oxide ($M_xO_y$) surface.

The present invention is further directed to a method of upconversion of two lower energy photons to a higher energy excited state by the use of a self-assembled multilayer, e.g., bilayer or trilayer, film as an effective architecture to facilitate photon upconversion as depicted in FIG. 2. The multilayer, e.g., bilayer or trilayer, films are composed of an acceptor molecule bound directly to a metal oxide surface via a surface binding group (phosphonate, carboxylate, etc.). A metal linking ion ($Zr^{4+}$, $Zn^{2+}$, etc.) is then coordinated to a second linking group on the acceptor molecule, that is not bound to the surface. Finally, a sensitizer molecule, or two or more sensitizer molecules, is then coordinated to the metal linking ion via its binding group (phosphonate, carboxylate, etc.).

Figure 4:
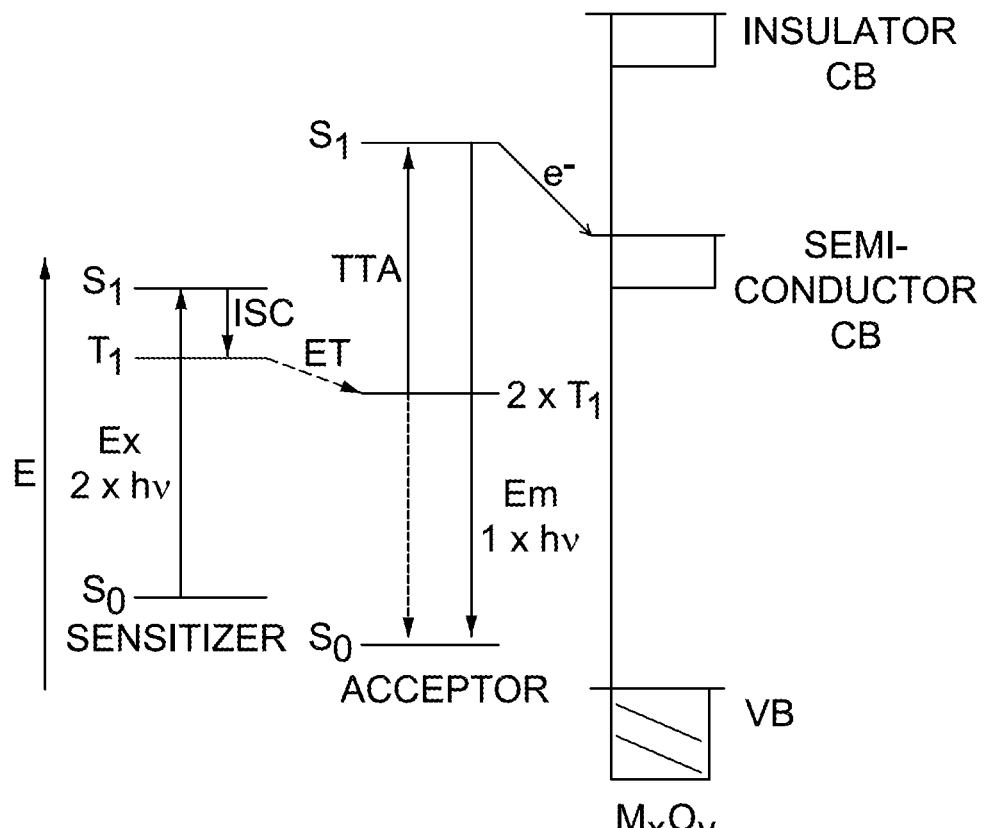
FIG. 4 is an energy level diagram depicting the absorption and energy transfer steps required for triplet-triplet annihilation ("TTA"). ($S_n$=singlet state, $T_n$=triplet state, Ex=excitation, ISC=intersystem crossing, ET=energy transfer, TTA=triplet-triplet annihilation, Em=upconverted emission, CB=conduction band, and VB=valence band).

The energetic requirements of the self-assembled multilayer, e.g., bilayer or trilayer, film are depicted in FIG. 4, which is an energy level diagram depicting the absorption and energy transfer steps required for triplet-triplet annihilation ("TTA"). The acceptor triplet energy must be equal to or lower than the sensitizer triplet energy. The acceptor singlet energy must be less than or equal to two times the acceptor triplet energy. To observe upconverted emission, the bilayer is formed on an "insulating" metal oxide surface, i.e., a surface with sufficiently high conduction band energy to inhibit electron transfer from the singlet state of the acceptor into the conduction band of the metal oxide. Alternatively, to charge separate and harness the upconverted singlet, as is necessary in solar cells, the conduction band potential must be lower than the singlet excited state reduction potential, and higher than the triplet excited state reduction potential of the acceptor molecule.

This strategy offers several advantages over conventional upconversion systems previously disclosed. First, a bilayer, or trilayer, assembly on a metal oxide surface ensures that the sensitizer and acceptor are in immediate proximity so that energy transfer is not limited by diffusion as required in solution or polymer films. Second, the complete monolayer coverage of the acceptor molecule helps to facilitate cross-surface energy transfer that is necessary for triplet-triplet annihilation to occur.

In general, the present invention is directed to a multilayer structure comprising a bi- or trilayer, self-assembled film on a surface having insulating properties. The surface is part of a substrate. The insulating surface may be part of a substrate having a bulk region having similar or different properties. The substrate may have a uniform composition throughout, or may comprise a core or bulk region and a different surface region. That is, the bulk region of the substrate may be conducting, superconducting, ultraconducting, semiconducting, or even insulating. The surface region, however, is insulating. In some embodiments, the substrate comprises a metal oxide surface and a bulk region.

The substrate may have a uniform composition throughout, or may comprise a core or bulk region and a different surface region, e.g., a core-shell composition. In some embodiments, the substrate comprises a metal oxide surface region and a bulk region.

In some embodiments, the substrate comprises a metal, such as, for example, copper, nickel, gold, silver, platinum, steel, glassy carbon, silicon, and alloys comprising one or more thereof. The metal may be the entire substrate, a core region material, or a shell/surface region material.

In some embodiments, the substrate comprises a metal oxide. The metal oxide may be the entire substrate, a core region material, or a shell/surface region material. In some embodiments, the surface region material is a metal oxide chosen from $SiO_2$, $SnO_2$, $TiO_2$, $Nb_2O_5$, $SrTiO_3$, ZnO, $Zn_2SnO_4$, $ZrO_2$, NiO, Ta-doped $TiO_2$, Nb-doped $TiO_2$, and combinations of two or more thereof. In other embodiments, the metal oxide comprises $TiO_2$, such as nanocrystalline $TiO_2$. In further embodiments, the metal oxide comprises NiO. In still other embodiments, the surface region comprises $ZrO_2$, such as nanoparticles of $ZrO_2$. In some embodiments, the entire substrate comprises the metal oxide material. In some embodiments, the metal oxide surface region is a layer coating a different bulk region material. For example, core-shell nanostructures are also possible. In some embodiments, a core-shell nanostructure may comprise one or more of: ZnO-coated $SnO_2$, MgO-coated $SnO_2$, $Al_2O_3$-coated $SnO_2$, $TiO_2$-coated In-doped $SnO_2$, and $TiO_2$-coated F-doped $SnO_2$. In some embodiments, the metal oxide surfaces provide a conducting surface. In some embodiments, the metal oxide surfaces provide a semiconducting surface. In some embodiments, the metal oxide surface provides an insulating surface. Methods of making various metal oxide materials are known to those of ordinary skill in the art.

In some embodiments, the metal oxide surface is planar. In some embodiments, the metal oxide surface has a higher surface area than a planar or flat surface. A high surface area means a surface area greater than a flat surface on the microscopic scale, such as is available on a single crystal. A high surface area can be achieved by any suitable means, such as, for example, by fusing particles together, or by etching a surface to introduce porosity. Some embodiments provide at least some of the metal oxide in the form of nanoparticles, nanocrystals, nanocolumns, nanotubes, nanosheets, nanoscrolls, nanowires, nanotips, nanoflowers, nanohorns, nano-onions, dendritic nanowires, or a combination of two or more thereof. Methods of making various forms of high surface area metal oxides are known to those of ordinary skill in the art. Examples of materials that may be suitable for some embodiments of the present invention appear in International Publication No. WO 2011/142848 to Corbea et al.

According to some embodiments of the present invention, the substrate, and more specifically, the metal oxide surface region, is coated with a self-assembled multilayer film, e.g., bilayer film, the film comprising: (a) an acceptor molecule covalently bonded to the metal oxide surface; (b) a linking coordinating metal ion; and (c) a sensitizer molecule bonded to the linking coordinating metal ion. According to some embodiments of the present invention, the substrate, and more specifically, the metal oxide surface region, is coated with a self-assembled multilayer film, e.g., bilayer film, the film comprising: (a) an acceptor molecule covalently bonded to the metal oxide surface; (b) a linking coordinating metal ion; and (c) two or more sensitizer molecules bonded to the linking coordinating metal ion, in series or in parallel. By series, it is meant that a first sensitizer molecule is linked to an acceptor molecule by a first linking coordinating metal ion, and a second sensitizer molecule is linked to the first sensitizer molecule by a second linking coordinating metal ion. This formation can be considered a trilayer film. By parallel, it is meant that a first sensitizer molecule is linked to a first acceptor molecule by a first linking coordinating metal ion, and a second sensitizer molecule is linked to a second acceptor molecule by a second linking coordinating metal ion. In the parallel formation, the first and second acceptor molecules are bonded to the metal oxide surface. This formation can be considered a co-sensitized bilayer film.

The multilayer film, e.g., bilayer film, may comprise one or more materials, i.e., an acceptor molecule, which self-assembles onto the metal oxide surface, for example, via a surface linking group. In some embodiments, the self-assembled acceptor molecule is covalently bonded to the metal oxide surface.

In some embodiments, the acceptor molecule covalently bonded to the metal oxide surface comprises a surface linking moiety, (which may be designated "L" herein and particularly in the structures provided in this disclosure), and an acceptor molecule, (which may be designated "A" herein and particularly in the structures provided in this disclosure). A surface linking group, L, may include a metal ion chelating moiety or a metal bonding moiety. In some embodiments, the surface linking group is capable of both chelating metal ions and covalently bonding to metals and/or metal ions. In some embodiments, the surface linking group, L, is selected from among —COOH, —PO$_3$H$_2$, —SO$_3$H, —OPO$_3$H, —OSO$_3$H, —SiO$_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and combinations thereof. In some embodiments, the bridging molecule comprises two or more surface linking groups, such as 2, 3, 4, 5 or more surface linking groups. In the context of structures of the invention, the surface linking groups, L, may be designated numerically, e.g., L$_1$, L$_2$, L$_3$, L$_4$, L$_5$, etc.

In some embodiments, the acceptor molecule, A, is one or more moiety selected from the group consisting chromophores whose singlet energy is greater than or equal to two times its triplet energy.

In some embodiments, suitable acceptor molecules include polyaromatic hydrocarbons having three or more fused aromatic rings, such as from three to about 20 fused aromatic rings, such as from three to about seven fused aromatic rings. Exemplary general structures for such acceptors are provided below:

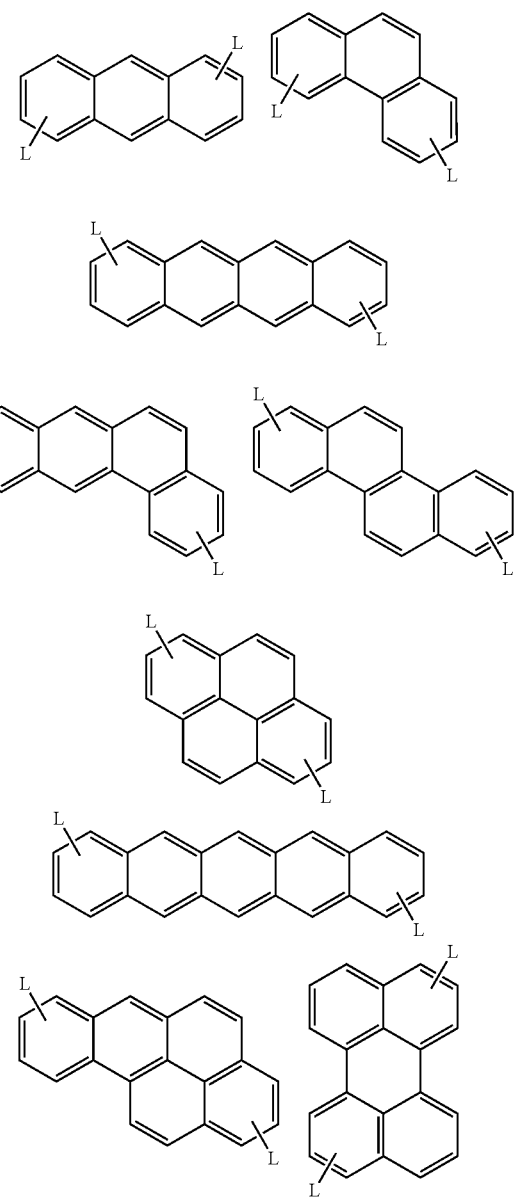

In these structures, L is defined above. L may be bonded to any carbon atom in the ring system, such as in the following exemplary structures:

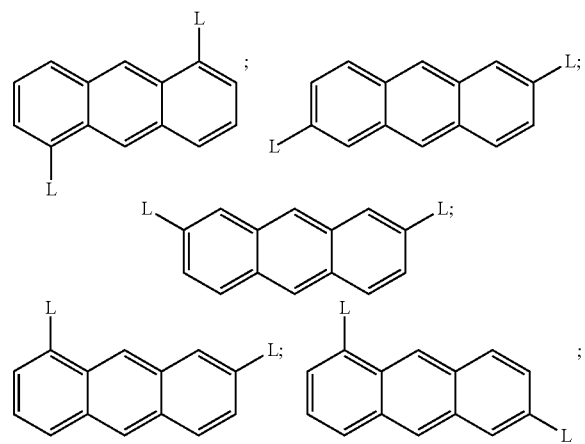

among others.

Examples of L-substituted acceptor molecules include anthracene, phenanthrene, phenalene, benzo[c]phenanthrene, tetracene, chrysene, tetraphene, pyrene, benzo[a]pyrene, perylene, pentacene, corannulene, benzo[ghi]perylene, coronene, ovalene, among others.

In some embodiments, suitable acceptor molecules include polyaromatic hydrocarbons having three or more fused aromatic rings, such as from three to about 20 fused aromatic rings, such as from three to about seven fused aromatic rings, and further comprising aromatic substituents having from 6 to about 26 carbon atoms. Exemplary general structures for such acceptors are provided below:

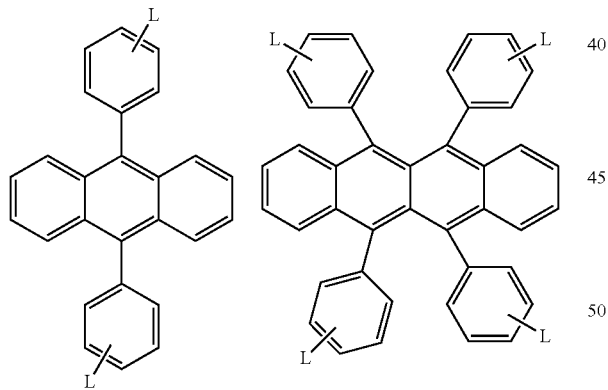

In these structures, L is defined above. L may be bonded to any carbon atom in the ring system. Examples of L-substituted acceptor molecules include acceptor molecules include 5,6,11,12-tetraphenyltetracene (rubrene); 9,10-diphenylanthracene (DPA); 9,10-bis(4-PO$_3$Et$_2$)anthracene; 9,10-bis(4-PO$_3$H$_2$)anthracene (DPPA); 9,10-bis(4-bromophenyl)anthracene; among others.

In some embodiments, suitable acceptor molecules include polyaromatic hydrocarbons having three or more fused aromatic rings, such as from three to about 20 fused aromatic rings, such as from three to about seven fused aromatic rings, and further comprising aliphatic (i.e., alkyl, alkenyl, and alkenyl) substituents having from one to about 18 carbon atoms. The aliphatic substituents may be further substituted with aromatic rings having from 6 to about 26 carbon atoms.

In the context of the present disclosure, unless otherwise stated, an alkyl substituent group or an alkyl moiety in a substituent group may be linear or branched. The alkyl group may comprise from one to about 20 carbon atoms, such as from one to about six carbon atoms. Examples of $C_{1-6}$ alkyl groups/moieties include methyl, ethyl, n-propyl, isopropyl, n-butyl, iso-butyl, tert-butyl, n-pentyl, n-hexyl, etc.

In the context of the present disclosure, unless otherwise stated, an alkenyl substituent group or an alkenyl moiety in a substituent group may be linear or branched. The alkenyl group may comprise from two to about 20 carbon atoms, such as from two to about six carbon atoms. Examples of $C_{2-6}$ alkenyl groups/moieties include ethenyl, n-propenyl, isopropenyl, n-butenyl, iso-butenyl, tert-butenyl, n-pentenyl, n-hexenyl, etc.

In the context of the present disclosure, unless otherwise stated, an alkynyl substituent group or an alkynyl moiety in a substituent group may be linear or branched. The alkynyl group may comprise from two to about 20 carbon atoms, such as from two to about six carbon atoms. Examples of $C_{2-6}$ alkynyl groups/moieties include ethynyl, n-propynyl, isopropynyl, n-butynyl, iso-butynyl, tert-butynyl, n-pentynyl, n-hexynyl, etc.

In the context of the present disclosure, aromatic or aryl encompasses aromatic moieties comprising from six to about 26 carbon atoms, such as from six to about fourteen carbon atoms. Aromatic may include benzene, naphthalene, phenanthrene, anthracene, pyrene, tetracene, pyridine, pyrimidine, pyrazine, pyridazine, triazines, pyrrole, imidazole, triazoles, quinoline, cinnoline, quinazoline, quinoxaline, naphthyridines, indole, indazoles, benzoimidazole, benzotriazoles, purines, furan, benzofuran, thiophene, benzothiophene, and so on.

Additional exemplary general structures for acceptors are provided below:

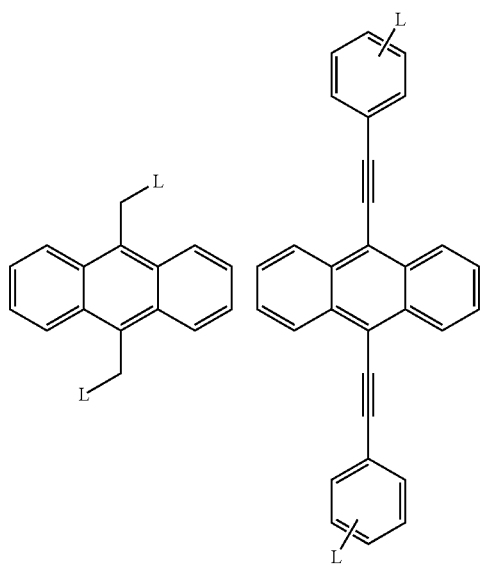

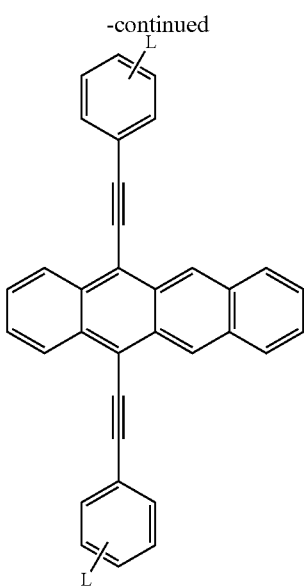

In these structures, L is defined above. L may be bonded to any carbon atom in the ring system. Examples of L-substituted acceptor molecules include include tert-butylpyrene, dimethylanthracene (DMA), 9,10-bis(phenylethynyl)anthracene (BPEA), 5,12-Bis(phenylethynyl)naphathecene (BPEN), bis(phenylethynyl)tetracene (bis-tetracene), among others.

In some embodiments, suitable acceptor molecules include polyaromatic hydrocarbons having three or more fused aromatic rings, such as from three to about 20 fused aromatic rings, such as from three to about seven fused aromatic rings, and further comprising aliphatic (i.e., alkyl, alkenyl, and alkenyl) substituents having from one to about 18 carbon atoms and still further comprising halogen substituents (i.e., fluoro, chloro, bromo, and iodo). The aliphatic substituents may be further substituted with aromatic rings having from 6 to about 26 carbon atoms. Exemplary general structures for such acceptors are provided below:

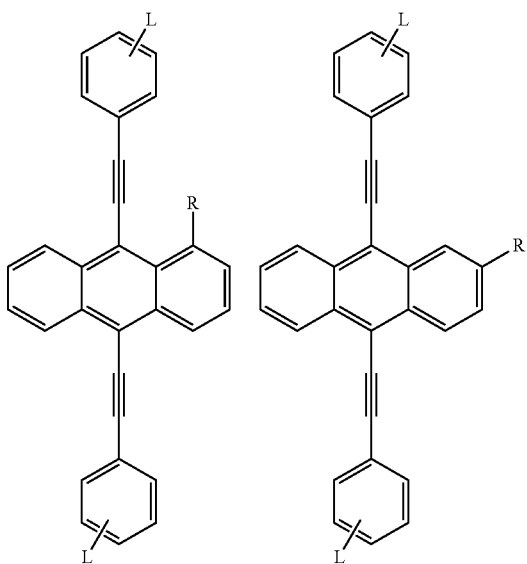

In these structures, L is defined above, and R is a halogen (i.e., fluoro, chloro, bromo, and iodo). L may be bonded to any carbon atom in the ring system. Examples of L-substituted acceptor molecules include 1-chloro-9,10-bis(phenylethynyl)anthracene (1CBPEA), 2-chloro-9,10-bis(phenylethynyl)anthracene (2CBPEA), among others.

In some embodiments, suitable acceptor molecules include substituted heteroaromatic rings (i.e., comprising sulfur, nitrogen, oxygen, boron, and combinations thereof in place of carbon atoms within the ring structure). In the context of the present disclosure, heteroaromatic or heteroaryl encompasses aromatic moieties comprising carbon and one or more of nitrogen, sulfur, or oxygen in an aromatic ring system. Heteroaromatic may comprise from one to about 26 carbon atoms, such as from three to about fourteen carbon atoms. Heteroaromatic may include pyridine, pyrimidine, pyrazine, pyridazine, triazines, pyrrole, pyrazole, imidazole, triazoles, quinoline, isoquinoline, cinnoline, quinazoline, quinoxaline, naphthyridines, indole, indazoles, benzoimidazole, benzotriazoles, pyrrolopyridines, pyrazolopyridines, imidazopyridines, triazolopyridines, pyrrolopyridazines, pyrazolopyridazines, imidazopyridazines, triazolopyridazines, pyrrolopyrimidines, pyrazolopyrimidines, purines, triazolopyrimidines, pyrrolopyrazines, pyrazolopyrazines, imidazopyrazines, triazolopyrazines, and so on. General structures for such acceptors is provided below:

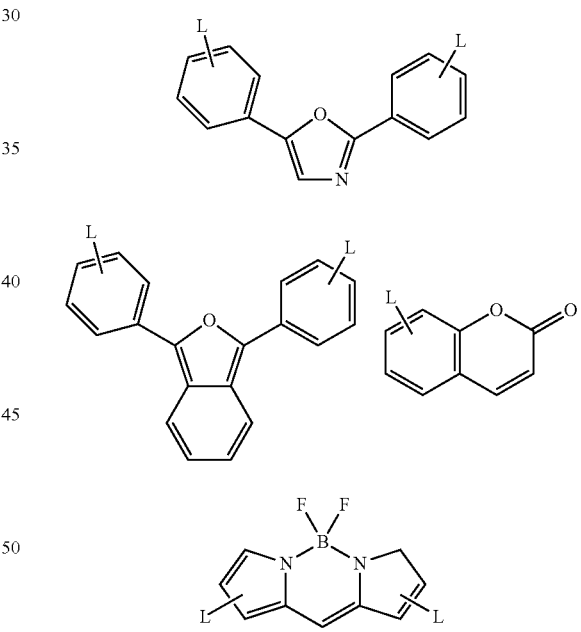

In these structures, L is defined above. L may be bonded to any carbon atom in the ring system. Examples of L-substituted acceptor molecules include 2,5-diphenyloxazole (PPO); coumarin 343 (C343); 1,3-diphenylisobenzofuran (DPBF); 2,6-Diethyl-4,4-difluoro-8-(-4-iodophenyl)-1,3,5,7-tetramethyl-4-bora-3a,4a-diaza-s-indacene (BODIPY-deriv); among others.

Still further, suitable acceptor molecules may comprise polyaromatic hydrocarbons comprising three or more fused aromatic rings further comprising amino, amido, or phosphoryl substituents. General structures for such acceptors is provided below:

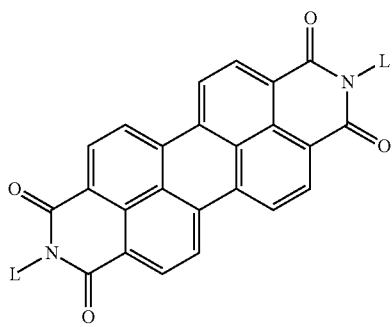

In these structures, L is defined above. Examples of L-substituted acceptor molecules include N,N-bis(ethylpropyl)-perylene-3,4,9,10-tetracarboxylicdiimide (PDI); among others.

In some embodiments, the bilayer, or trilayer, film comprises one or more of a linking coordinating metal ion. The linking coordinating metal ion may coordinate with one or more atoms of the acceptor molecule, and further may coordinate with one or more atoms of the sensitizer molecule, or more than one sensitizer molecule, which is more fully disclosed below. Mutual coordination to one ion, but any suitable numbers of ions can be employed. In some embodiments, two, three, four, five, six, or more ions coordinate the acceptor molecule to the sensitizer molecule. Also, each assembly need not coordinate the same ratio of acceptor molecules to sensitizer molecules. Steric interactions and other factors may cause one acceptor molecule to coordinate to just one sensitizer molecule, while another acceptor molecule might coordinate to more than one sensitizer molecule. Also, as can be appreciated, one molecule may coordinate to more than one other molecule. In some embodiments, the ion is chosen from $Cu^{2+}$, $Co^{2+}$, $Ni^{2+}$, $Zn^{2+}$, $Mn^{2+}$, $Fe^{2+}$, $Sr^{2+}$, $Al^{3+}$, $V^{3+}$, $In^{3+}$, $Fe^{3+}$, $Gd^{3+}$, $Y^{3+}$, $Yb^{3+}$, $Nd^{3+}$, $Ce^{3+}$, $La^{3+}$, $Sc^{3+}$, $Dy^{3+}$, $Zr^{4+}$, $Ti^{4+}$, $Sn^{4+}$, and combinations thereof. In certain embodiments, the ion is $Zn^{2+}$. In still other embodiments, the ion comprises a zirconium ion. As used herein, the ion can be in any suitable form. In some cases, the ion has no detectable bond, ionic or otherwise, to any species other than to the molecules of the assembly. In other cases, the ion may be in the presence of one or more counter-ions and/or other compounds. For example, an oxygen anion or chloride anion could be found in proximity to a $Zr^{4+}$ ion. In another example, one or more solvent compounds could coordinate to the ion as it joins the molecules of the assembly.

In some embodiments, the sensitizer molecule, S, is one or more moiety selected from the group consisting chromophores whose triplet energy is greater than the triplet energy of the acceptor molecule listed above. The sensitizer molecule coordinates to the linking ion through self-assembly, via a metal ion linking group.

According to some embodiments of the invention, the sensitizer molecule comprises a coordinated metal ion and a molecule comprising chelating groups capable of coordinating with the metal ion. Coordinated metal ions may be selected from among platinum cation (e.g., $Pt^{2+}$), palladium cation (e.g., $Pd^{2+}$), zinc cation (e.g., $Zn^{2+}$), ruthenium cation (e.g., $Ru^{2+}$), lead cation (e.g., $Pb^{2+}$), iridium (e.g., $Ir^{3+}$) among others.

In some embodiments, the sensitizer molecule comprising the chelating groups may include porphyrins, including the basic porphine structure and substituted porphines, and derivatives of porphine and substituted porphines. Suitable sensitizers having porphyrin structure may include the following general structures:

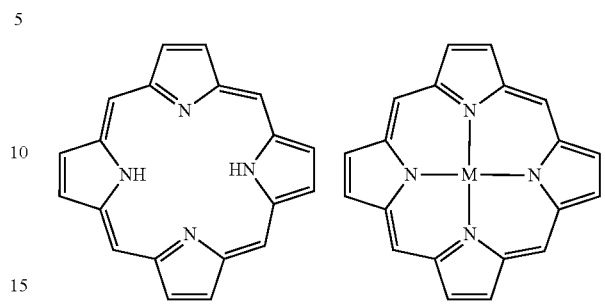

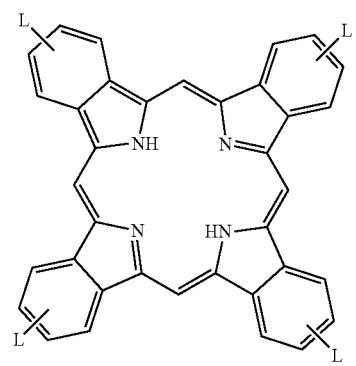

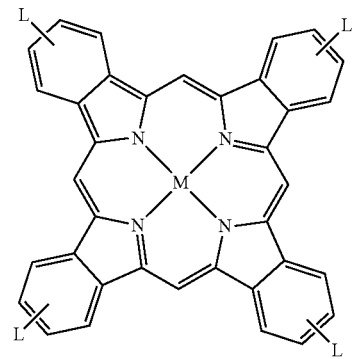

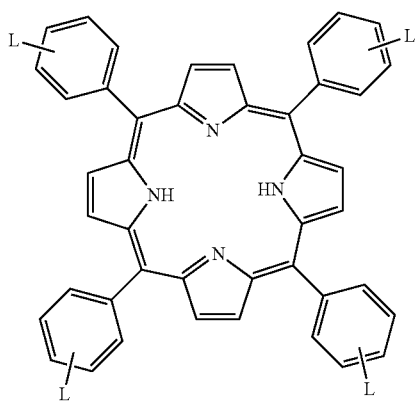

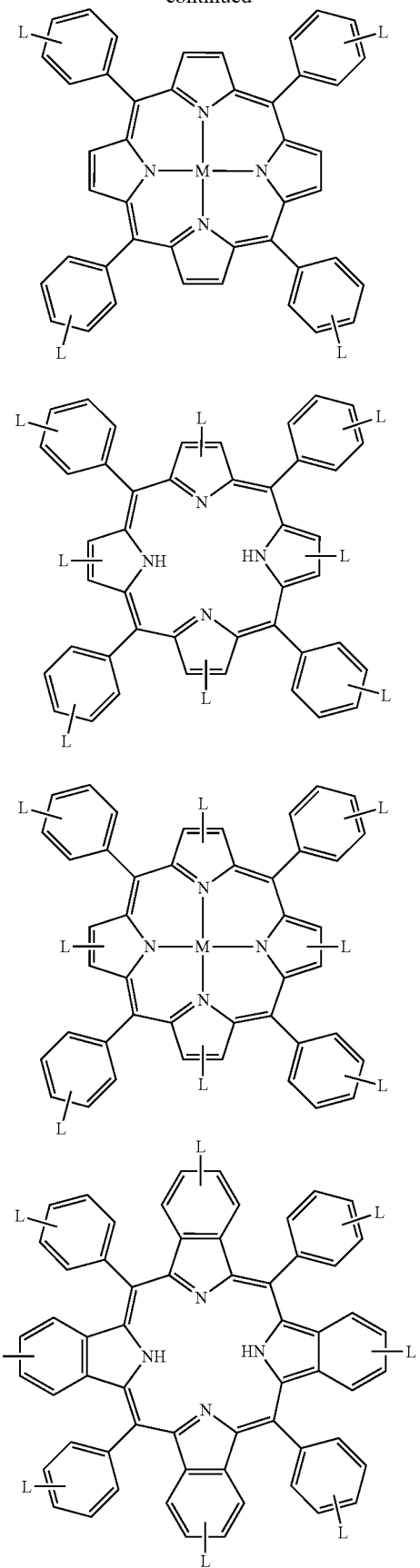
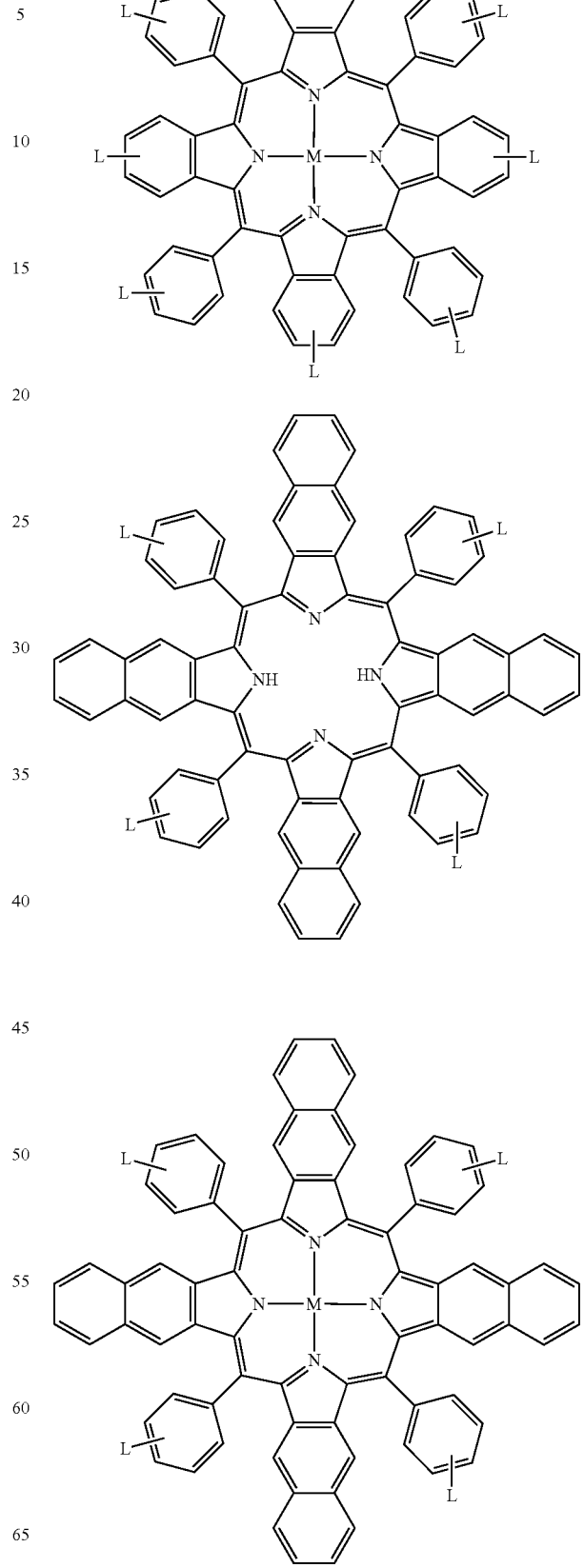

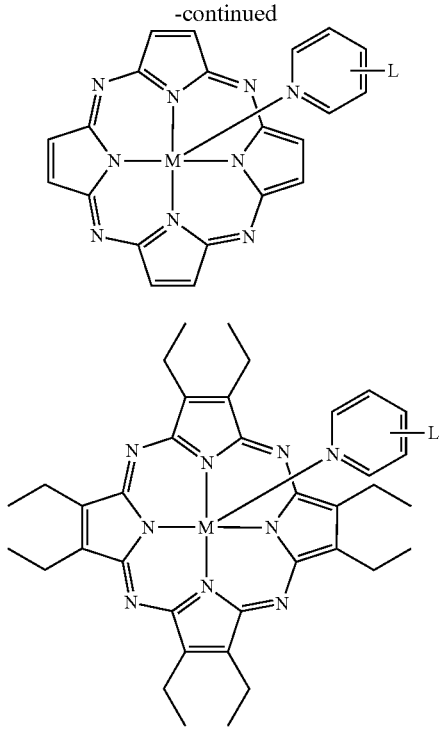

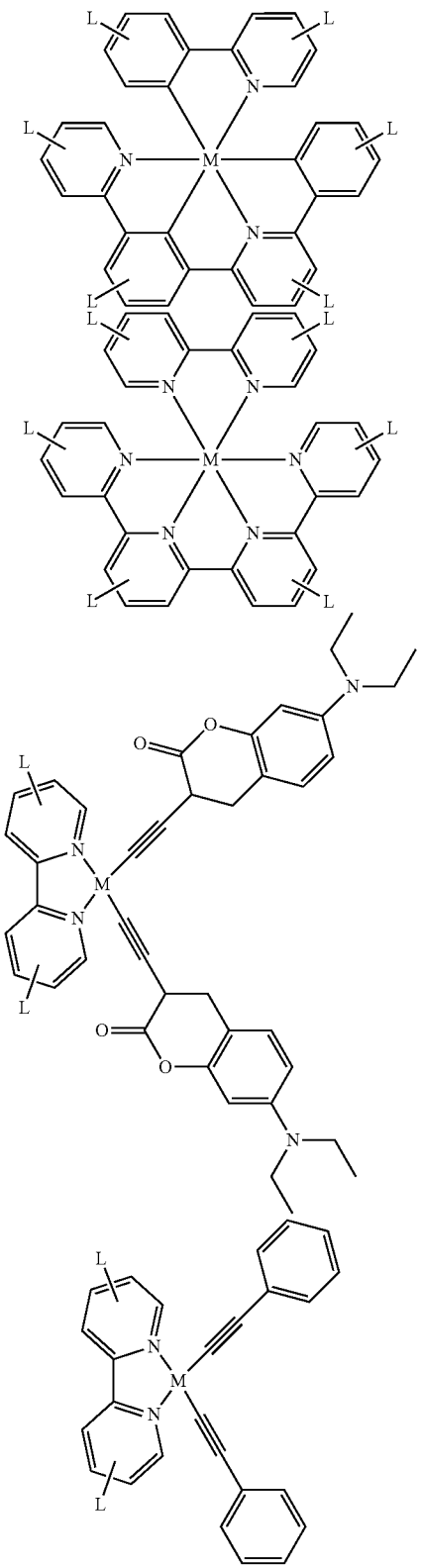

In these structures, L is defined above, and M is selected from Pt, Pd, Zn, Pb, Ir, Ru, or other transition metal ions. L may be bonded to any carbon atom in the ring system. Examples of such sensitizers include Pt(II)tetra(carboxyphenyl) porphyrin (PtTCPP), tetraphenyltetrabenzoporphyrin ($H_2$TPBP), platinum(II) tetraphenyltetrabenzoporphyrin (PtTPBP), palladium(II) tetraphenyltetrabenzoporphyrin (PdT PBP), zinc(II) tetraphenyhetrabenzoporphyrin (ZnTPBP), palladium(II) tetrabenzoporphyrin (PdTBP), platinum(II) tetraphenyltetranaphthylporphyrin (PtTPTNP), palladium(II) tetraanthraporphyrin (PdTAP), platinum(II) octaethylporphyrin (PtOEP), palladium(II) octaethylporphyrin (PdOEP), zinc(II) tetraphenylporphyrin (ZnTPP), palladium(II) meso-tetraphenyl-octamethoxide-tetranaphtho[2,3]porphyrin (PdPh$_4$OMe$_8$TNP), palladium(II) octabutoxyphthalocyanine (PdPc(OBu)$_8$), Ruthenium(II) [15-(40-ethynyl-(2,20;60, 200-terpyridinyl))-bis[(5,50,-10,20-di(20, 60-bis(3,3-dimethylbutoxy)phenyl)porphinato)zinc(II)] ethyne][40-pyrrolidin-1-yl-2,20;60,200-terpyridine]bis (hexafluoro-phosphate) (PyrRuPZn2), palladium(II) tetrakisquinoxalinoporphyrin (PQ$_4$Pd), palladium(II) porphyrin (PPd), among others.

Further examples of sensitizer molecules comprising a chelated metal may comprise molecules comprising chelating moieties other than porphyrins, such as 2-phenylpyridine, 2,2'-bipyridine, 2H-chromen-2-one, and boron-dipyrromethene (BODIPY). Exemplary structures include the following general structures:

In these structures, L is defined above, and M is selected from Pt, Pd, Zn, Pb, Ir, and Ru. L may be bonded to any carbon atom in the ring system. Examples of such sensitizers include ruthenium(II) tris-dimethylbipyridine ([Ru(dmb)$_3$]$^{2+}$), ruthenium(II) bis-bipyridine(phenyl (pyrene)) ([Ru(bpy)₂(Phen)-pyrene]²⁺), ruthenium(II) bis-bipyridine(phenyl(ethynylpyrene)) ([Ru(bpy)₂(Phen)ethynyl-pyrene]²⁺), iridium(II) tris-phenylpyridine (Ir(ppy)₃), platinum(II) bis-acetylide-boron-dipyrromethene (Pt(a)-BODIPY), Pt1, and Pt2.

Still further examples of sensitizer molecules that do not comprise chelated metals may be based on 4,4-difluoro-4-bora-3a,4a-diaza-s-indacene (BODIPY), 9H-thioxanthen-9-one, xanthene, and buckyballs.

An exemplary structure based on BODIPY may have the following general structure:

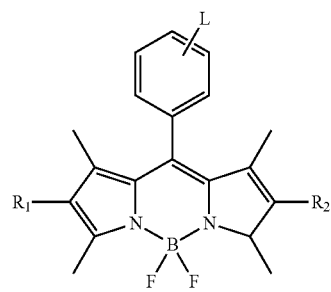

In these structures, L is defined above, and $R_1$ and $R_2$ may be selected from among halogen (i.e., fluoro, chloro, bromo, and iodo), substituted alkynyl, and substituted thiophene. L may be bonded to any carbon atom in the ring system. Specific substituents for $R_1$ and $R_2$ include the following:

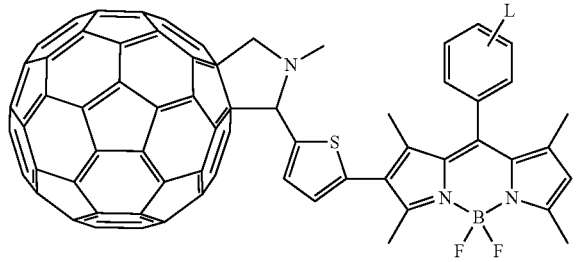

Another example comprising BODIPY has the following structure:

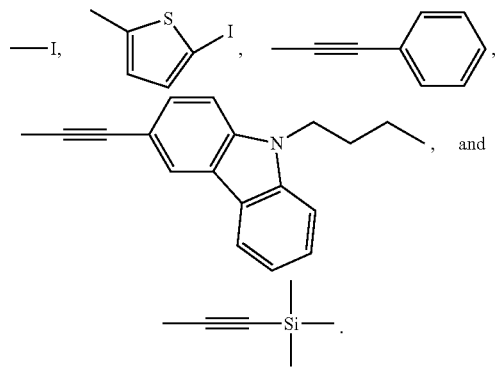

In these structures, L is defined above. L may be bonded to any carbon atom in the ring system.

Another example comprising 9H-thioxanthen-9-one has the following structure:

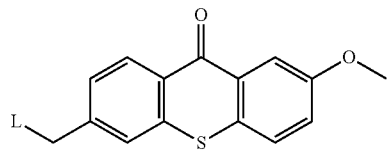

In these structures, L is defined above.

Another example comprising xanthene has the following structure:

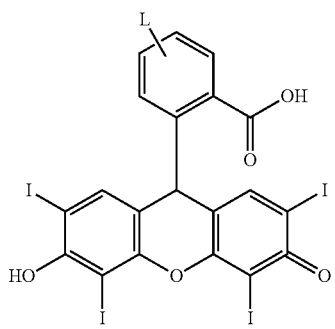

In these structures, L is defined above. L may be bonded to any carbon atom in the ring system.

Another example comprising a buckyball has the following general structure:

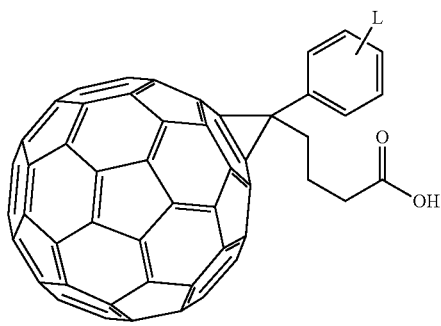

In these structures, L is defined above. L may be bonded to any carbon atom in the ring system.

Another example comprising thermally activated delayer dluorescence molecules like 4CzTPN-Ph that has the following structure:

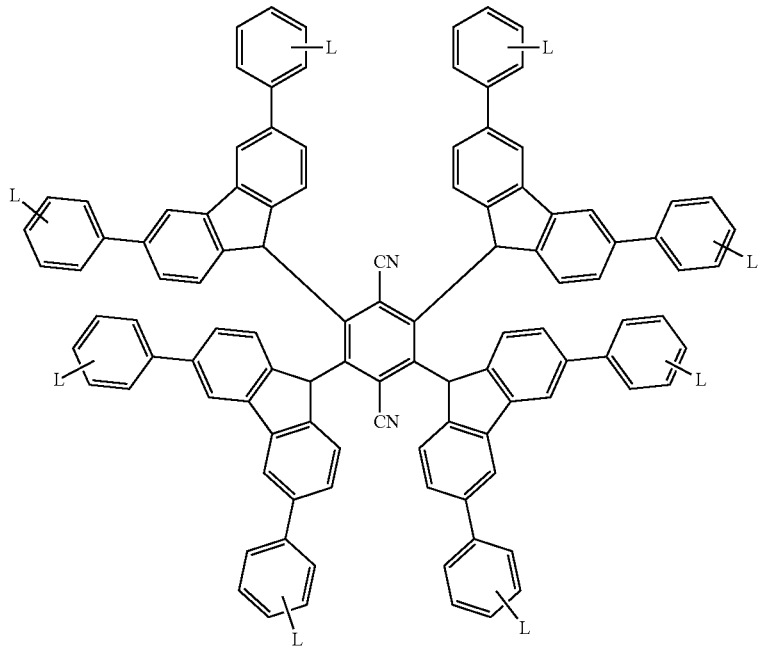

In these structures, L is defined above. L may be bonded to any carbon atom in the ring system.

Still further examples of sensitizers include biacetyl; 2-methoxythioxanthone (2MeOTX); 2-Iodo-6-methyl trimethylsilyl-1,3,5,7-tetramethyl-8-phenyl-4,4-difluoro boradiazaindacene (BODIPY-derivative); BODIPY-C60-dyad; BODIPY-heterodimer; 2,4,5,7-Tetraiodo-6-hydroxy-3-fluorone (TIHF); naphthalene diimide NDI-derivative; among others.

In some embodiments, the assembly may comprise the following pairs of acceptor and sensitizer:

| Acceptor | Sensitizer |
| --- | --- |
| Perylene | PtTPBP |
| 2CBPEA | PtTPBP |
| BD-1 | PtTPBP |
| BD-2 | PtTPBP |
| BDPPA | PtTPBP |
| BODIPY-deriv | PtTPBP |
| BPEA | PtTPBP |
| Perylene | Pt(II)-BODIPY |
| BPEA | PdTPBP |
| Rubrene | PdTPBP |
| Bis-tetracene | PdTPBP |
| Perylene | PdTPBP |
| Perylene | PQ$_4$Pd |
| Perylene | ZnTPBP |
| Perylene-BODIPY dyad | PdTBP |
| Perylene-BODIPY dyad | ZnTPBP |
| Anthracene | [Ru(dmb)$_3$]$^{2+}$ |
| DMA | [Ru(dmb)$_3$]$^{2+}$ |
| DPA | [Ru(dmb)$_3$]$^{2+}$ |
| PPO | Biacetyl |
| Rubrene | PdTAP |
| DPA | PdOEP |
| DPA | PtOEP |
| Rubrene | PdPc(OBu)$_8$ |
| Perylene | ZnTPP |
| C343 | ZnTPP |
| Rubrene | PdPh$_4$Ome$_8$TNP |
| BPEN | PdPh$_4$Ome$_8$TNP |
| PPO | 2MeOTX |
| Pyrene | Ir(ppy)$_3$ |
| Tert-butylpyrene | Ir(ppy)$_3$ |
| 1CBPEA | BODIPY-derivative |
| BPEA | C70 |
| Perylene | C70 |
| DPA | TIHF |
| DPA | Pt1 |
| DPA | Pt2 |
| DPA | [Ru(bpy)$_2$(Phen)-pyrene]$^{2+}$ |
| DPA | [Ru(bpy)$_2$(Phen)ethynyl-pyrene]$^{2+}$ |
| DPA | PtOEP |
| DPA/DPBF | PtOEP |
| DPBF | PtOEP |
| PDI | PyrRuPZn2 |
| PDI | PtTPTNP |
| PDI | H$_2$TPBP |
| Perylene | PPD |
| DPPA | PtTCPP |

In one exemplary embodiment of the invention, bilayer films (ZrO$_2$-DPPA-Zn—PtTCPP) are composed of a metal oxide (ZrO$_2$), an acceptor molecule (9,10-bis(4-PO$_3$H$_2$) anthracene, "DPPA"), Zn$^{2+}$ ions and a sensitizer (Pt(II)tetra (carboxyphenyl) porphyrin, "PtTCPP") as depicted in FIGS. 3A and 3B.

In one exemplary embodiment of the invention, bilayer films (ZrO$_2$-DPPA-Zn—PtTCPP/PdTCPP) are composed of a metal oxide (ZrO$_2$), an acceptor molecule (9,10-bis(4—PO$_3$H$_2$)anthracene, "DPPA"), Zn$^{2+}$ ions, a first sensitizer (Pt(II)tetra(carboxyphenyl) porphyrin, "PtTCPP"), and a second sensitizer (Pd(II)tetra(carboxyphenyl) porphyrin, "PdTCPP") as depicted in FIG. 3C.

In one exemplary embodiment of the invention, trilayer films (MO$_2$-DPPA-Zn—PdTCPP-Zn—PtTCPP) are composed of a metal oxide (ZrO$_2$), an acceptor molecule (9,10-bis(4—PO$_3$H$_2$)anthracene, "DPPA"), Zn$^{2+}$ ions (first linking ion), a first sensitizer (Pd(II)tetra(carboxyphenyl) porphyrin, "PdTCPP"), Zn$^{2+}$ ions (second linking ion), and a second sensitizer (Pt(II)tetra(carboxyphenyl) porphyrin, "PtTCPP") as depicted in FIG. 3C.

Upconversion Dye-Sensitized Solar Cell (Dssc)

Figure 5:
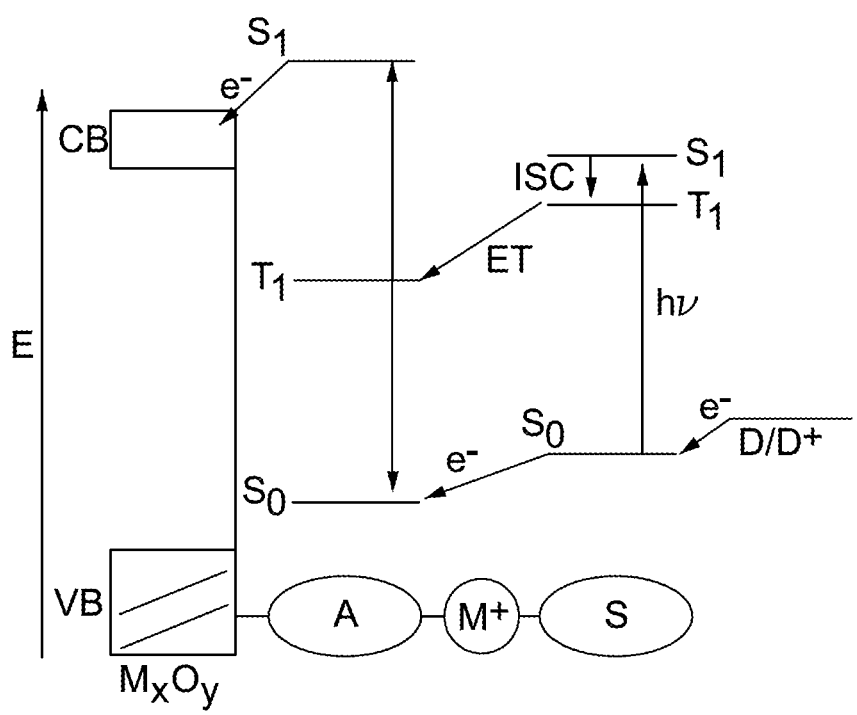
FIG. 5 is an illustration of a schematic energy-level diagram of a bilayer DSSC according to some embodiments of the present invention. $M_xO_y$=semiconductor, A=acceptor, $M^+$=metal ion, S=sensitizer, D=redox mediator.

The present invention relates in some embodiments to a method of using an assembly for harvesting light in a dye-sensitized solar cell. Such a cell can comprise a multilayer film for harvesting light, in other embodiments. Suitable electrolyte compositions include those containing a desired redox mediator in a suitable solvent, for example. Suitable counter electrodes, cell arrangements, and other components of such dye-sensitized solar cells are known. FIG. 5 is a schematic illustration of such an assembly. M$_x$O$_y$ represents a surface comprising a metal oxide and having a high surface area; A represents an acceptor molecule linked to the surface through a surface-linking group; and S represents a sensitizing molecule. The first molecule and the second molecule are joined via mutual coordination to an ion, labeled M$^+$ in the figure.

When constructing an electrode intended to function as a photoanode, reference to FIG. 5 may illustrate some useful concepts. In one embodiment, a bilayer photoanode for a DSSC comprises a high surface area metal oxide (M$_x$O$_y$) electrode with a valance band (VB) and conduction band (CB) covered with a monolayer of a first molecule (A). FIG. 4 provides an energy diagram of M$_x$O$_y$, A, S, and an unbound redox mediator (D/D$^+$). A is an acceptor in this embodiment, the lowest energy singlet excited state of A achieved at an energy above ground state results in electron transfer from A to the conduction band of M$_x$O$_y$. The excited state of A may be not sufficiently oxidizing to result in electron transfer from the VB of M$_x$O$_y$ to A. S is a chromophore in a bilayer DSSC, it can be chosen such that the lowest energy triplet excited state of S is of sufficient energy to result in energy transfer from S to A. Additionally, a sufficient driving force for electron transfer from S to oxidized A is desired. The oxidation potential of S can be sufficient to result in electron transfer from the unbound redox mediator (D) to the oxidized S. In such a bilayer film, electron transfer can occur through several mechanisms, depending on which chromophore absorbs a photon.

EXAMPLES

The following non-limiting examples are provided to further illustrate the present invention.

Experimental Section 1.

Materials and Methods:

Materials.

1,4-dibromobenzene, anthraquinone, n-butyl lithium, nickel bromide, triethylphosphite, trimethylsilyl bromide, zinc acetate dehydrate, H$_2$PtCl$_6$ and tetrabutylammonium perchlorate (Sigma-Aldrich) and Pt(II) meso-tetra(4-carboxyphenyl)porphine (Frontier Scientific), were purchased from their respective suppliers, in parentheses, and used as received. All other reagents and solvents (analytical reagent grade) have been purchased and used without further purification from Alfa Aesar. Tetrahydrofuran and dichloromethane used in synthesis have been dried and degassed prior to use. Fluorine-doped tin oxide (FTO) coated glass (sheet resistance 15Ω/Y) was purchased from Hartford Glass Co. Meltonix film (1170-25), Ti-Nanoxide T solgel paste (11421) and Vac'n Fill Syringe (65209) were purchased from Solaronix. Micro glass cover slides (18×18 mm) were obtained from VWR. ZrO$_2$ solgel paste was prepared following a previously reported procedure (1).

Sample Preparation.

DPPA. 4,4'-(anthracene-9,10-diyl)bis(4,1-phenylene)diphosphonic acid (DPPA) was prepared by following known procedures for related anthracene complexes. Briefly, lithiated dibromobenzene was added to anthraquinone which was followed by reduction with KI and NaPO$_2$H$_2$ to generate 9,10-bis(4-bromophenyl)anthracene (2) The phosphonate ester, tetraethyl 4,4'-(anthracene-9,10-diyl)bis(4,1-phenylene)diphosphonate, was generated using an Arbuzov reaction (3) and the product was then hydrolyzed with TMS-Br to yield DPPA. (4)

Synthesis

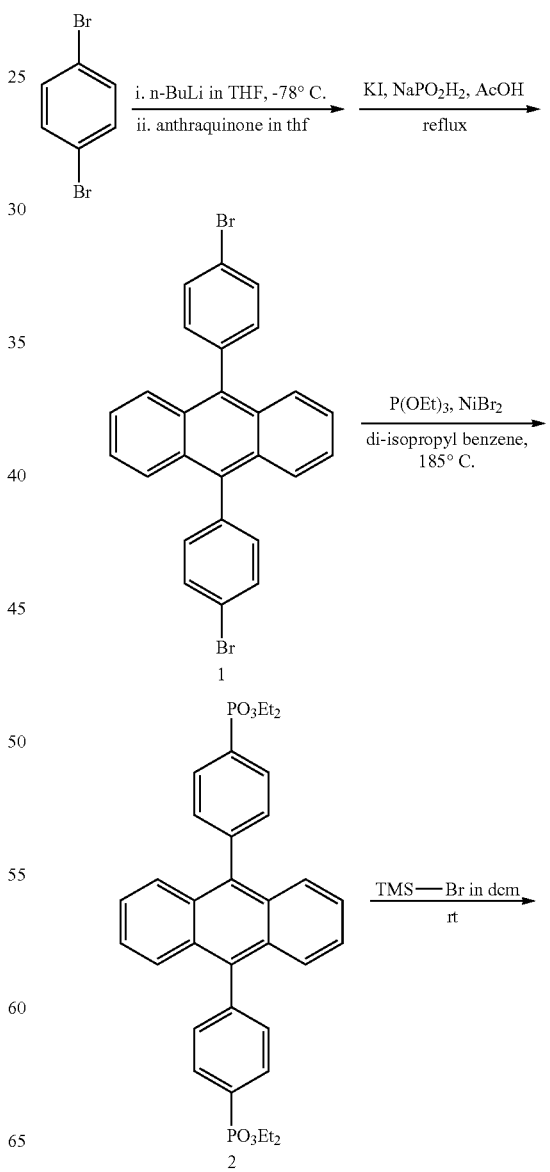

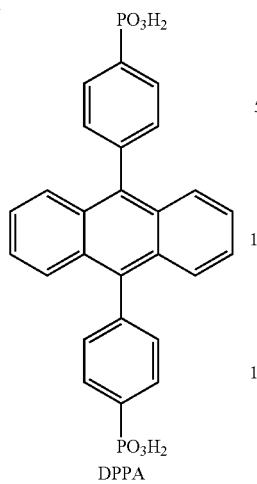

9,10-bis(4-bromophenyl)anthracene (1)

1,4-dibromobenzene (2.36 g, 10 mmol) is dissolved in 100 ml dry THF and the solution is cooled to −78° C. using a dry ice-acetone bath. To this solution, n-butyl lithium (6.25 ml of 1.6 M solution in hexanes, 10 mmol) is added slowly. Once the addition is complete, the solution is left to stir at −78° C. for an additional 30 minutes. After 30 minutes, a solution of anthraquinone (1.04 g, 5 mmol) in THF is added dropwise. The resulting solution is stirred at −78° C. for 3 hours and then at room temperature overnight. The solvent is then evaporated and the mixture is extracted with ether. The ethereal solution is washed with copious amounts of water to remove the ionic impurities, dried with anhydrous magnesium sulphate and evaporated to dryness. KI (3 g, 18 mmol), $NaPO_2H_2$ (3 g, 34 mmol) and 30 ml glacial acetic acid is added to this crude product and the reaction mixture is refluxed for 2 hours. After 2 hours the reaction mixture is allowed to cool to room temperature and the precipitate formed is filtered, washed with water and dried in a vacuum desiccator. The crude product is purified by re-crystallization from dichloromethane to yield pure 1. Yield—0.87 g, 36%. $^1$H NMR (600 MHz, $d_6$-dmso): δ (ppm) 7.87 (4H, d, J=7.2 Hz); 7.59-7.57 (4H, m); 7.47 (4H, m); 7.44 (4H, d, J=7.32 Hz). $^{13}$C spectrum could not be recorded due to poor solubility of the compound.

Tetraethyl 4,4'-(anthracene-9,10-diyl)bis(4,1-phenylene)diphosphonate (2)

1 (0.87 g, 1.8 mmol) is dissolved in 15 ml of 1,3-diisopropylbenzene and heated to 185° C. under nitrogen. Nickel bromide (0.04 g, 0.18 mmol) is then added to this solution followed by addition of triethylphosphite (0.8 ml, 5 mmol) directly into the solution dropwise over a period of 30 minutes. The reaction mixture is left for heating overnight. The following day $NiBr_2$ (0.02 g) and triethylphosphite (0.4 ml) are added and the reaction mixture is again heated overnight. Another batch of $NiBr_2$ (0.01 g) and triethylphosphite (0.2 ml) are added to the reaction mixture on the next day and heating is continued. After a total of 3 days at 185° C., the solvent and the excess tritethylphosphite are distilled off at room temperature. The resulting precipitate formed is re-crystallized by dissolving it in dichloromethane and layering with hexanes to yield pure 2. Yield—0.61 g, 57%.

ESI-MS (m/z): Calculated for $C_{34}H_{36}O_6P_2$—602.2, Observed—603.2 $[M+1]^+$; $^1$H NMR (600 MHz, CDCl$_3$): δ (ppm) 8.08 (4H, dd, J=7.8, 5.3 Hz); 7.65-7.62 (8H, m); 7.40-7.35 (4H, m); 4.37-4.26 (8H, m); 1.48 (12H, t, J=7.08 Hz). $^{13}$C NMR (150 MHz, CDCl$_3$): δ (ppm) 143.43, 143.41, 136.24, 131.88, 131.81, 131.53, 131.43, 129.52, 128.52, 127.26, 126.63, 125.51, 62.39, 62.35, 16.52, 16.48.

4,4'-(anthracene-9,10-diyl)bis(4,1-phenylene)diphosphonic acid (DPPA)

To a solution of 2(0.43 g, 0.72 mmol) in 7 ml of dry dichloromethane under nitrogen, trimethylsilyl bromide (1.9 ml, 14.4 mmol) is added dropwise. The solution is then stirred at room temperature for 4 hours. After 4 hours, the reaction flask is placed in an ice bath and 5.7 ml of water is added while stirring. The off-white precipitate is collected, washed with water and dried in a vacuum desiccator to yield pure DPPA. Yield—0.29 g, 84%. ESI-MS (m/z): Calculated for $C_{26}H_{20}O_6P_2$—490.1, Observed—489.2 $[M-1]^-$; $^1$H NMR (600 MHz, $d_6$-dmso): δ (ppm) 8.01-7.93 (4H, m); 7.64-7.52 (8H, m); 7.50-7.43 (4H, m). $^{13}$C spectrum could not be recorded due to poor solubility of the compound.

Photophysical and Electrochemical Cells were prepared. FTO glass was cut into 2.2×2.2 cm (for $ZrO_2$) or 2×2.5 cm (for $TiO_2$) pieces and an active area of 1 cm$^2$ metal oxide was prepared by doctor blading $TiO_2$ (solaronix) or $ZrO_2$ sol gel paste (1 layer Scotch tape) and sintering. Dye loading was performed as described in the manuscript. Surface coverages (Γ in mol cm$^{-2}$) were estimated with the expression Γ=A(λ)/ε(Γ)/1000. In these analyses the molar extinction coefficients (ε) for the complexes in DMSO solution was used (See Table 1), and A(λ) was the maximum absorbance of the sensitized slides. For $ZrO_2$-DPPA the maximum surface coverage of Γ=1.04×10$^{-7}$ mol cm$^{-2}$ was achieved for a 4 μm thick film. Comparable surface coverage (Γ=7.49×10$^{-8}$ mol cm$^{-2}$) was achieved loading N3 on the same $ZrO_2$ films.

A small hole (d=1.1 mm) was drilled into the corner of the 2.2×2.2 cm (or 2×2.5 cm for $TiO_2$ cells) glass slide that does not have metal oxide. For the electrochemical cells, with $TiO_2$, the counter electrode was prepared by dropcasting 50 μL of a 5 mM $H_2PtCl_6$ solution in ethanol that was heat dried at 400° C. for 15 minutes. A 1.5 mm wide 2.2×2.2 cm (for $ZrO_2$) or 2 mm wide 2×2 cm (for $TiO_2$) Meltonix film was placed between the two glass slides and the entire ensemble is heated to ~150° C. for 7 seconds. For the $TiO_2$ samples the two glass slides were offset by ~5 mm to ensure sufficient area for electrode contacts. The cells were then transferred to a glove box where dry and oxygen free solvent (MeCN for the $ZrO_2$ samples and a solution of 0.3 M TBA in MeCN for the $TiO_2$ samples) was injected using a Vac'n Fill Syringe (Solaronix) through the 1 mm hole to fill the interior of the cells. The cell is then sealed with a meltonix flim and small piece of micro glass cover slide that covers the hole used for solvent injection.

Analytical Methods.

Photophysical and Electrochemical Measurements.

Absorption spectra were recorded on an Agilent 8453 UV-Visible photo diode array spectrophotometer. Extinction coefficients for PtTCPP and DPPA in DMSO were determined from the absorption spectra of solutions having a known concentration of chromophore in a 1×1 cm quartz cuvette. Thin film absorption spectra were obtained by placing dry, derivatized $TiO_2$ and $ZrO_2$ slides perpendicular to the detection beam path.

Steady-State emission data were collected at room temperature using an Edinburgh FLS980 fluorescence spectrometer. The samples were excited using the output from either a housed 450 W Xe lamp/single grating (1800 l/mm, 250 nm blaze) Czerny-Turner monochromator or a Nd:YAG laser (Aixiz, AD-532-400T). The output from the Nd:YAG laser was passed through a variable neutral density filter (Edinburgh F-B01 laser mount), a 2 mm diameter iris (Newport ID-1.0) and then directed to the sample via a flip mirror. Emission from the sample was first passed through a 532 nm notch filter (Thorlabs Inc., NF533-17), then a single grating (1800 l/mm, 500 nm blaze) Czerny-Turner monochromator and finally detected by a peltier-cooled Hamamatsu R928 photomultiplier tube. Laser intensities were measured using a power meter (Ophir Vega 7Z01560) with a high sensitivity power sensor (Ophir 3A-FS 7Z02628).

Amperometric i-t data was collected using a CH Instruments CHI630E electrochemical analyzer using a two electrode configuration ($TiO_2$ working, Pt counter) held at 0 V applied potential. The samples were irradiated with either an AM1.5 solar simulator (Light Model 66181 oriel corrected with a standard air-mass filter) passing through a 495 nm long pass filter or with 532 nm from a Nd:YAG laser (Aixiz, AD-532-400T). The intensity of light from the solar simulator was manipulated by varying the distance between the source and sample. The laser light intensity was controlled by using a neutral density filter as described above for the photophysical measurements. A Model T132 Sutter Driver/Timer (UniBlitz) coupled to a mechanical shutter (Vincent Associates, VS25) was placed between the light source and sample to control 5 second light-dark intervals over a 60 second time period.

$^1$H and $^{13}$C NMR spectra were recorded on a Bruker 600 MHz FT NMR (Model: Avance-DPX 600) and the spectral shifts are calibrated with respect to residual protonated solvent peaks ($\delta$7.26 and 2.49 for $CDCl_3$ and $d_6$-dmso, respectively). ESI-MS measurements were carried out on a JEOL AccuTOF JMS-T100LC instrument.

Attenuated total reflectance infrared (ATR-IR) spectra were recorded using a Bruker Alpha FTIR spectrometer (SiC Glowbar source, DTGS detector) with a Platinum ATR quickSnap sampling module (single reflection diamond crystal). Spectra were obtained by placing dry, derivatized $TiO_2$ and $ZrO_2$ slides active side down on the diamond face and data was acquired from 800 to 1800 $cm^{-1}$ at a resolution of 4 $cm^{-1}$. All ATR-IR spectra are reported in absorbance with a blank versus atmosphere.

Electrochemical Measurements. Cyclic voltammetry (CV) and differential pulse voltammetry (DPV) measurements were performed by using a CH Instruments Model CHI630E Series Electrochemical Workstation with DPPA- or PtTCPP-derivatized FTO slides as the working electrode, a platinum wire counter electrode and a Ag wire reference electrode. The FTO working electrodes were functionalized with DPPA and PtTCPP by soaking overnight in their respective 200 μM stock solutions in DMSO. All measurements were performed in 0.3 M $(TBA)ClO_4$ acetonitrile solution with ferrocene as an internal standard. All potentials have been converted and quoted with respect to the normal hydrogen electrode (with $Fc^+/Fc$ being 630 mV relative to NHE). (8, 9) Singlet ($E_{1/2}(S_1)$) and triplet ($E_{1/2}(T_1)$) excited state reduction potentials were calculated by using $E_{1/2}(S_1$ or $T_1) = E_{1/2}^{ox} - \Delta G_{ES}$, where $E_{1/2}^{ox}$ is the ground state oxidation potential and $\Delta G_{ES}$ is the thermally equilibrated lowest energy excited state. The $\Delta G_{ES}$ for the singlet excited state of DPPA was estimated from the intersection of the normalized absorption and emission spectra ($\Delta G_{ES}(S_1)$=2.98 eV). The $\Delta G_{ES}$ for the triplet excited state potential was assumed to be similar to 9,10-diphenylanthracene ($\Delta G_{ES}(T_1)$=1.78 eV). (10) The $\Delta G_{ES}$ for the singlet and triplet excited state of PtTCPP were estimated from a tangent line to the inflection point of the lowest energy absorption onset ($\Delta G_{ES}(S_1)$=2.19 eV) and highest energy emission onset ($\Delta G_{ES}(T_1)$=1.90 eV), respectively (Table S1).

Absolute emission quantum yields for $ZrO_2$-DPPA and $ZrO_2$-PtPTCPP were acquired using an integrating sphere incorporated into the Edinburgh FLS980 fluorescence spectrometer. The samples were prepared and sealed in the sandwich cell-type architecture as described above and placed in the center of the sphere which includes a movable mirror for direct or indirect excitation (De Mello Method). Emission quantum yields were then acquired and calculated.

Emission quantum yields for upconverted emission from $ZrO_2$-DPPA-Zn—PtTCPP ($\phi_{UC}$) are estimated relative to $ZrO_2$-PtTCPP ($\phi_{PtTCPP}$=0.016 from Table 1) using equation 1.

$$\phi_{UC} = \phi_{PtTCPP} \frac{I_{UC}}{I_{PtTCPP}} \frac{A_{PtTCPP}}{A_{UC}} \frac{\eta_{UC}^2}{\eta_{PtTCPP}^2} \quad (eq\ 1)$$

Where $I_{UC}$ and $I_{PtTCPP}$ are the integrated emission intensities of $ZrO_2$-DPPA-Zn-PtTCPP (from 380-510 nm) and $ZrO_2$-PtTCPP (from 600-850 nm), respectively. $A_{UC}$ and $A_{PtTCPP}$ are their respective absorbance at 532 nm. Given the similar cell architecture, composed of glass, $ZrO_2$ and MeCN, the refractive indices ($\eta_{UC}$ and $\eta_{PtTCPP}$) are assumed to be the same for both samples. The emission intensities were acquired with 532 nm excitation (2.5 $W/cm^2$) using the sandwich cell architecture placed at an ~40 degree angle relative to the incident excitation. Emission, perpendicular to the incident laser was passed through a 532 nm notch filter (Thorlabs Inc., NF533-17) before entering the monochromator/detector.

Time-Resolved Emission. The excited state lifetime for $ZrO_2$-DPPA was acquired using the FLS980's time-correlated single-photon counting capability (1024 channels; 200 ns window) with data collection for 10,000 counts. Excitation was provided by an Edinburgh EPL-360 picosecond pulsed light emitting diode (360±10 nm, pulse width–892 ps) operated at 10 MHz. The excited state lifetime for $ZrO_2$-PtTCPP was acquired using the FLS980's multi-channel scaling (MCS) acquisition mode with 532 nm excitation from a 60 W microsecond flashlamp (pulse width<2.5 μs) and a 100 Hz repetition rate. Kinetics were evaluated using the Edinburgh software package.

Results and Discussion.

The bilayer film depicted in FIG. 3B was prepared by step-wise soaking of nanocrystalline $TiO_2$ or $ZrO_2$ films in three separate solutions of 4,4'-(anthracene-9,10-diyl)bis(4,1-phenylene)diphosphonic acid (DPPA), $Zn(CH_3COO)_2$ and Pt(II)tetrakis(4-carboxyphenyl)porphyrin (PtTCPP). Anthracene and platinum porphyrin derivatives were selected as the TTA-UC pair because they are known to exhibit efficient UC emission ($\Phi_{em}$>20%).

Each step of the surface modification procedure was monitored by UV-Vis or attenuated total reflectance infrared (ATR-IR) spectroscopy. For $ZrO_2$-DPPA the maximum surface coverage ($\Gamma$=1.04×10$^{-7}$ mol cm$^{-2}$ for a 4 μm thick film) was achieved by soaking $ZrO_2$ in a 200 μM DPPA solution of DMSO for 48 hrs or for 4 hours with $N_2$ bubbling. Presumably bubbling aids in the percolation of the dye solution through the porous film. ATR-IR spectra of $ZrO_2$-DPPA after soaking in a methanol solution of 400 μM $Zn(CH_3COO)_2$ shows an increased absorption from 1000-1150 cm$^{-1}$. This increase, which is complete in <10 minutes, indicates the coordination of transition metal ions, like $Zn^{2+}$, to the non-surface bound phosphonate groups.

Figure 6:
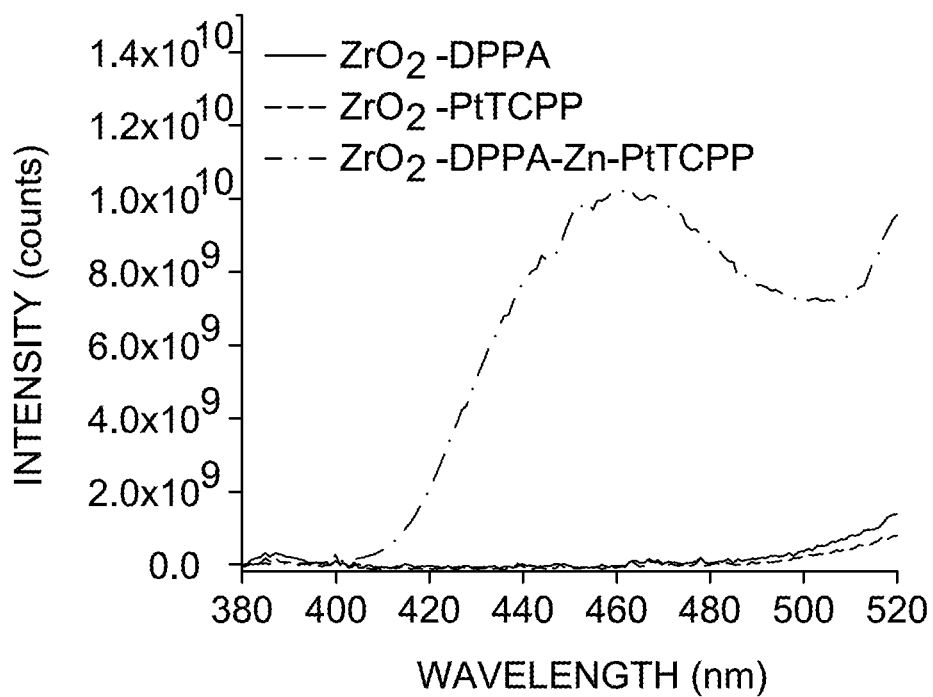
FIG. 6 are emission spectra from $ZrO_2$-DPPA, $ZrO_2$—PtTCPP, and $ZrO_2$-DPPA-Zn—PtTCPP films under 532 nm excitation (95 mW/cm$^2$).

Emission from $ZrO_2$-DPPA, $ZrO_2$—PtTCPP, and $ZrO_2$-DPPA-Zn—PtTCPP films were measured from 380-520 nm upon excitation from a 532 nm Nd:YAG laser (95 mW/cm$^2$) and the results are shown in FIG. 6. It can be seen in FIG. 6 that no emission is observed from $ZrO_2$-DPPA. This result is expected given that $ZrO_2$-DPPA has no absorption transitions below 450 nm. Alternatively, while $ZrO_2$-PtTCPP does absorb at 532 nm, normal phosphorescence was observed from 600-700 nm with no emission features <600 nm. For the bilayer film, $ZrO_2$-DPPA-Zn-PtTCPP, excitation at 532 nm results in an emission peak at ~450 nm. This emission feature resembles singlet emission from $ZrO_2$-DPPA upon excitation at 400 nm.

The emission spectra in FIG. 6 demonstrate that the $ZrO_2$-DPPA-Zn—PtTCPP bilayer film undergoes photon upconversion presumably through absorption by PtTCPP, Dexter energy transfer to DPPA, TTA between two DPPA triplet states, followed by fluorescent emission from DPPA.

Figure 7:
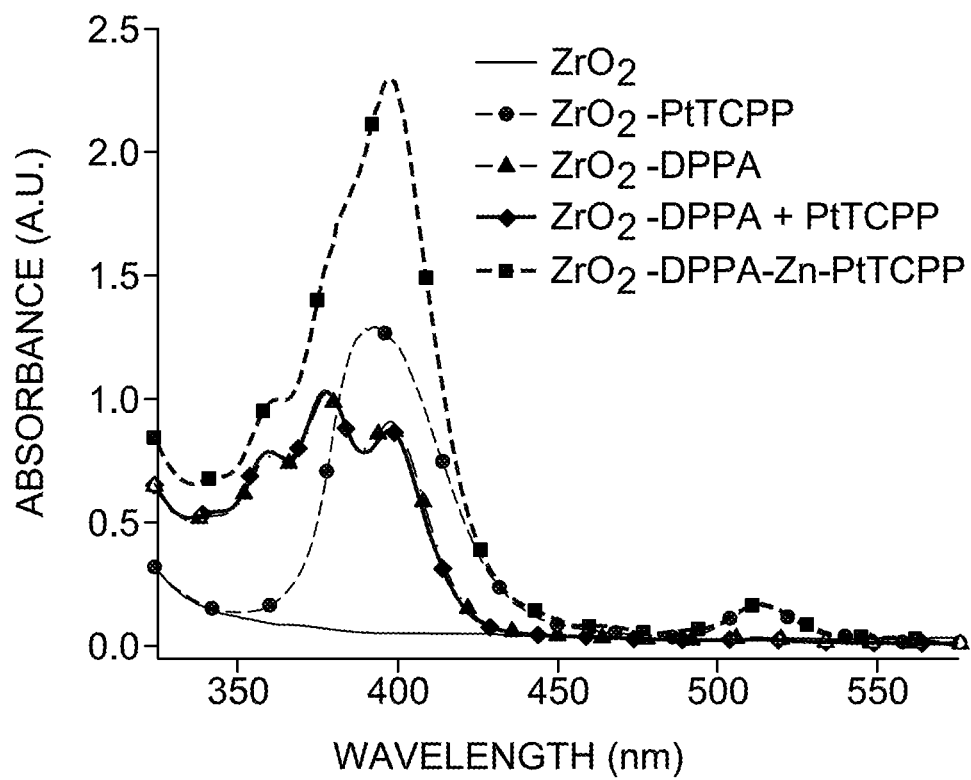
FIG. 7 are absorption spectra for $ZrO_2$, $ZrO_2$-DPPA, $ZrO_2$—PtTCPP and $ZrO_2$-DPPA after soaking in PtTCPP with ($ZrO_2$-DPPA-Zn—PtTCPP) and without ($ZrO_2$-DPPA+PtTCPP) $Zn(CH_3COO)_2$ pre-treatment.

The sensitizer layer was prepared by soaking $ZrO_2$-DPPA-Zn in a 200 μM PtTCPP solution of DMSO. The absorption spectrum of the bilayer film, $ZrO_2$-DPPA-Zn—PtTCPP, is the sum of the DPPA and PtTCPP spectra and the concentration of PtTCPP can readily be controlled by varying the treatment time. See FIG. 7. For example, after 60 minutes of loading, a ratio of approximately 2:1 of DPPA: PtTCPP is achieved. In the absence of $Zn^{2+}$ treatment, nominal contribution from PtTCPP absorption is observed indicating that the spectral changes are not simply due to co-deposition of PtTCPP and DPPA on $ZrO_2$. The above results are consistent with formation of a $MO_2$-DPPA-Zn—PtTCPP bilayer structure resembling the scheme in FIG. 3B.

Figure 8:
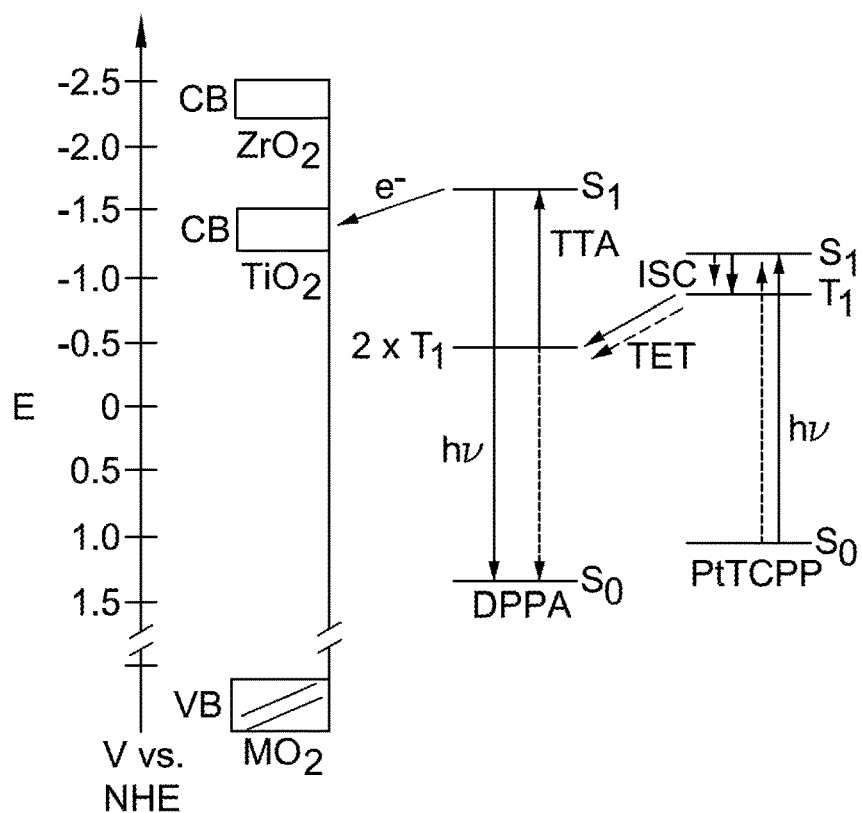
FIG. 8 is a depiction of a TTA-UC bilayer energy level diagram. Electronic transitions and relative energetics for DPPA and PtTCPP and the conduction band energies of $TiO_2$ and $ZrO_2$. ($S_n$=singlet state, $T_n$=triplet state, ISC=intersystem crossing, TET=triplet energy transfer, TTA=triplet-triplet annihilation).

The choice of nanocrystalline metal oxide substrate, $TiO_2$ versus $ZrO_2$, for a given experiment is dependent on the energy of the donor, acceptor and conduction band of the semiconductor. The ground and excited state potentials for DPPA and PtTCPP and the conduction band potentials for $TiO_2$ and $ZrO_2$ are depicted in FIG. 8. The relatively high conduction band potential of $ZrO_2$, approximately 1 V more negative than $TiO_2$, inhibits emission quenching by excited state electron transfer from the dyes to the semiconductor surface and is the ideal scaffold for UC emission experiments.

Figure 9:
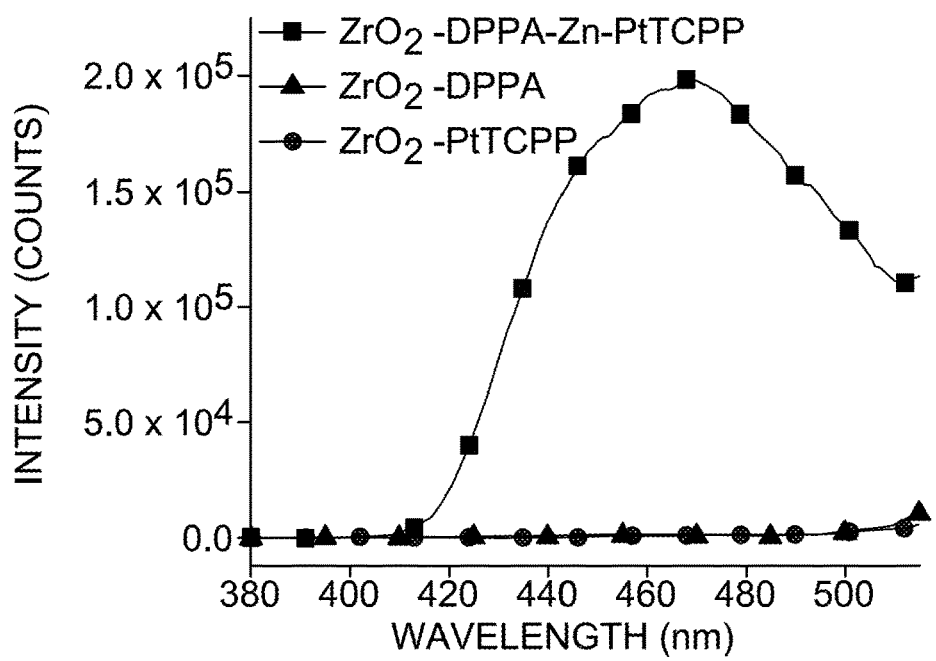
FIG. 9 are emission spectra for $ZrO_2$-DPPA, $ZrO_2$—PtTCPP and $ZrO_2$-DPPA-Zn—PtTCPP in argon deaerated MeCN under 532 nm excitation (2.5 W/cm$^2$).

Emission spectra for $ZrO_2$-DPPA, $ZrO_2$—PtTCPP and $ZrO_2$-DPPA-Zn—PtTCPP upon 532 nm excitation (2.5 W/cm$^2$) are shown in FIG. 9. No high energy emission (400-515 nm) is observed from either $ZrO_2$-DPPA or $ZrO_2$—PtTCPP films. This is expected given the lack of absorption for DPPA at 532 nm and that PtTCPP undergoes down converted phosphorescent emission with a peak at 674 nm with nominal emission below 600 nm (vide infra). On the other hand, the bilayer film, $ZrO_2$-DPPA-Zn—PtTCPP, exhibits an emission peak maximum at 468 nm that resembles singlet emission from DPPA. This result demonstrates that $ZrO_2$-DPPA-Zn—PtTCPP is an effective architecture to facilitate 532 to 468 nm TTA-UC. The upconverted emission quantum yield for $ZrO_2$-DPPA-Zn—PtTCPP is 0.0023±0.0003 as measured relative to $ZrO_2$—PtTCPP (Φ=0.016). See Table 1.

TABLE 1

Photophysical properties of DPPA and PtTCPP.

| | $\lambda_{abs}^a$ (nm) (ε, × 10$^4$ M$^{-1}$ cm$^{-1}$) | $\lambda_{em}^b$ (nm) | $\tau^c$ (μs) | Φ | $k_r^d$ (s$^{-1}$) | $k_{nr}^e$ (s$^{-1}$) | $E_{1/2}^{ox}$ (V vs NHE) | $E_{1/2}$ (S$_1$)$^f$ | $E_{1/2}$ (T$_1$)$^g$ |
|---|---|---|---|---|---|---|---|---|---|
| DPPA | 358 (0.77), 376 (1.27), 397 (1.20) | 423 | 0.0021 | 0.527 | 2.56 × 10$^8$ | 2.29 × 10$^8$ | 1.33 | −1.65 | −0.45 |
| PtTCPP | 405 (10.28), 510 (1.03), 540 (0.19) | 669 | 41.08 | 0.016 | 3.89 × 10$^2$ | 2.40 × 10$^4$ | 1.04 | −1.15 | −0.86 |

$^a$Measured in a DMSO solution.
$^b$Emission for DPPA and PtTCPP on $ZrO_2$ in MeCN.
$^c$Lifetime from an exponential tail fit to the excited state decay (ex: 360 (DPPA) and 510 (PtTCPP) nm).
$^d k_r = \Phi/\tau$.
$^e k_{nr} = (1 - \Phi)/\tau$.
$^f$The singlet excited state reduction potential.
$^g$The triplet excited state reduction potential.

Figure 10:
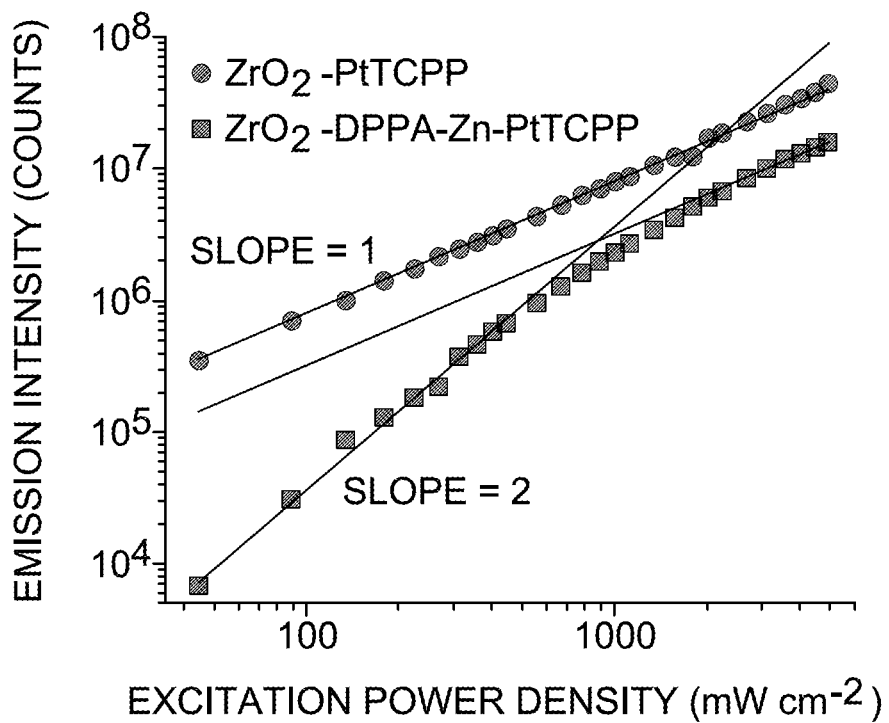
FIG. 10 is a graph depicting emission intensity for $ZrO_2$-DPPA-Zn—PtTCPP at 460 nm (square) and $ZrO_2$-PtTCPP at 670 nm (circle) versus 532 nm excitation intensity.

The emission intensity dependence for $ZrO_2$-DPPA-Zn—PtTCPP and $ZrO_2$-PtTCPP with respect to excitation intensity (see FIG. 10) lends further support for the TTA-UC mechanism. Emission from $ZrO_2$—PtTCPP exhibits a linear dependence (slope=1) on excitation intensity. $ZrO_2$-DPPA-Zn—PtTCPP, on the other hand, exhibits a quadratic (slope=2) to linear (slope=1) intensity dependence that is symptomatic of TTA-UC[23]. It is worth noting that while the quadratic to linear crossover intensity is relatively high (880 mW/cm$^2$) the extinction coefficient for PtTCPP at 532 nm (ε=1.72×10$^3$ L mol$^{-1}$ cm$^-$) is significantly lower than that for platinum octaethylporphyrin (ε=2.26×10$^4$ L mol$^{-1}$ cm$^{-1}$), a more commonly studied sensitizer dye for TTA-UC.

Figure 11:
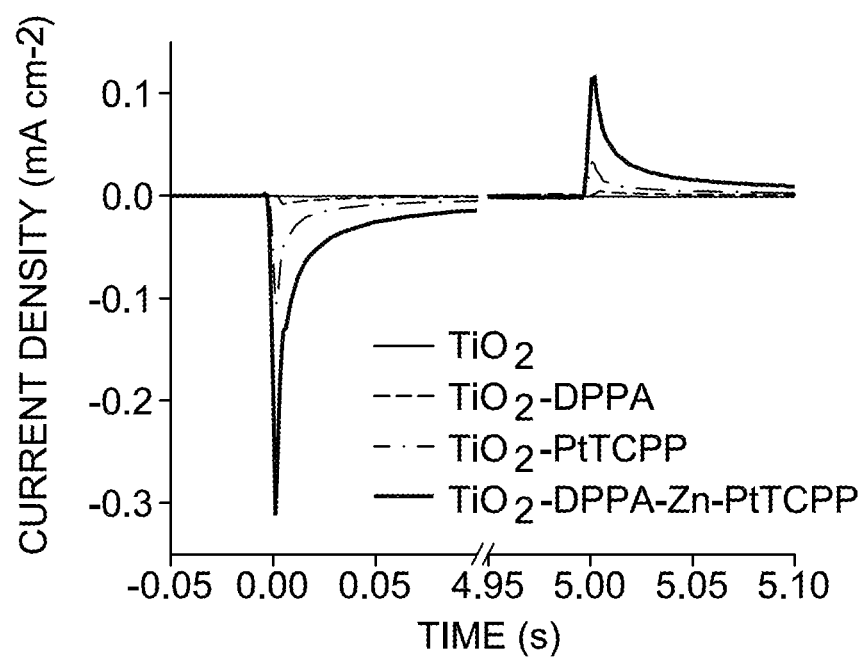
FIG. 11 are amperometric i-t curves for $TiO_2$, $TiO_2$-DPPA, $TiO_2$—PtTCPP, and $TiO_2$-DPPA-Zn—PtTCPP under two equivalent AM1.5 solar irradiation passing through a 495 nm long-pass filter (shutter open at 0 s, closed at 5 s).

Nanocrystalline $TiO_2$ is a common semiconductor used in dye-sensitized solar cells (DSSCs) because its conduction band potential is sufficiently positive to act as an electron acceptor for excited state molecules bound to the surface. To test the feasibility of photocurrent generation from TTA-UC in the bilayer film we performed amperometric i-t measurements using $TiO_2$-DPPA-Zn—PtTCPP, $TiO_2$-DPPA, and $TiO_2$—PtTCPP films as the working electrodes in an electrochemical cell. The cells were irradiated with a two equivalent AM1.5 solar spectrum passed through a 495 nm long pass filter and a shutter programed to open and close every 5 seconds. See FIG. 11. The peak transient photocurrent from $TiO_2$-DPPA-Zn—PtTCPP (0.31 mA/cm$^2$) is approximately three times the sum of its parts ($I_{TiO2\text{-}DPPA}$=0.008 mA/cm$^2$ and $I_{TiO2\text{-}PtTCPP}$=0.1 mA/cm$^2$). Even under one sun irradiation, a small (0.015 mA/cm$^2$) but reproducible photocurrent enhancement is observed for TiO$_2$-DPPA-Zn—PtTCPP relative to TiO$_2$—PtTCPP and TiO$_2$-DPPA. Given that TiO$_2$-DPPA-Zn—PtTCPP has similar absorption to the sum of TiO$_2$—PtTCPP and TiO$_2$-DPPA monolayer films, we attribute this photocurrent enhancement to a new photon-to-current generation pathway provided by TTA-UC.

Figure 12:
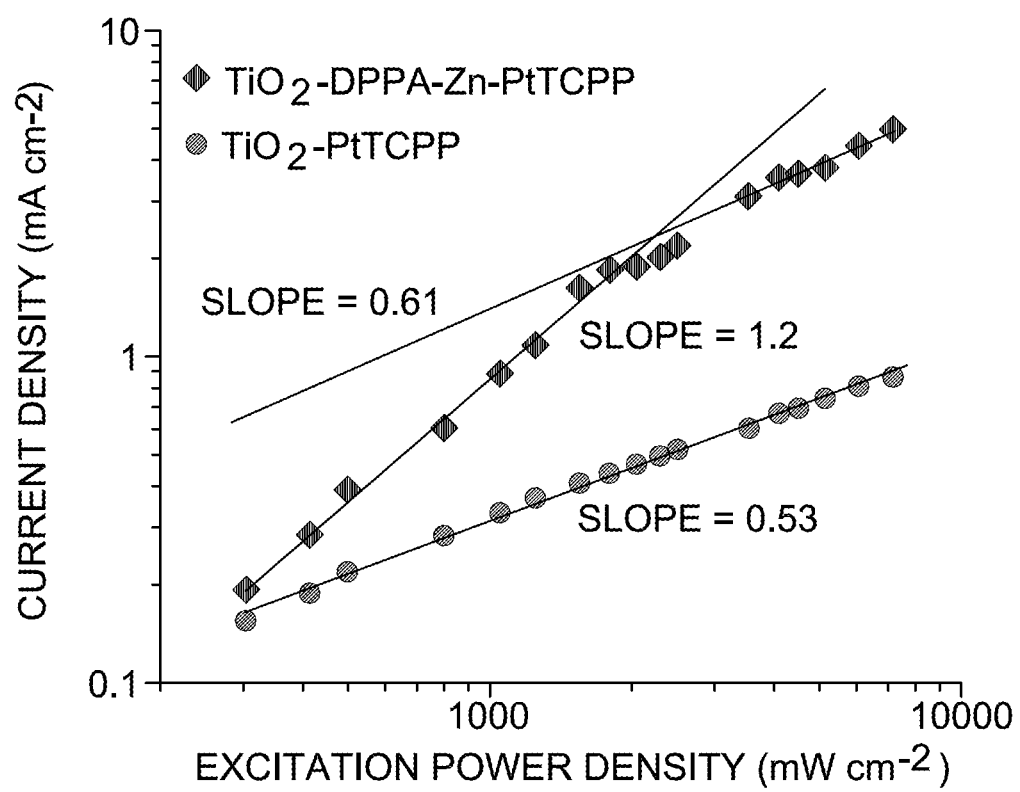
FIG. 12 is a graph depicting peak photocurrent density from $TiO_2$-DPPA-Zn—PtTCPP and $TiO_2$—PtTCPP with respect to 532 nm excitation intensity. ($TiO_2$ thin film working electrode, platinum counter electrode, 0.3 M TBA-$ClO_4$ in $N_2$ deaerated MeCN electrolyte at 0 V applied potential.)

The peak photocurrent for TiO$_2$-DPPA-Zn—PtTCPP with respect to 532 nm excitation intensity exhibits a change in slope from 1.2 to 0.61 that is reminiscent of the quadratic to linear behavior anticipated for TTA-UC. See FIG. 12. This change in slope is in contrast to that for TiO$_2$—PtTCPP which exhibits a linear dependence (slope=0.53). Under the same conditions, a similar linear dependence (slope=0.5) is observed for the common DSSC dye, N3 (cis-bis(isothiocyanato)bis(2,2'-bipyridyl-4,4'-dicarboxylato)ruthenium (II)), which is known to undergo a one photon to one electron photocurrent generation mechanism. These results strongly suggest that the photocurrent generation from TiO$_2$-DPPA-Zn—PtTCPP can be attributed to a TTA-UC mechanism. It is unclear why the slopes for the photocurrent measurements are lower than those observed with TTA-UC emission measurements but is likely due to the known intensity dependence of electron injection yield and back electron transfer rate for dyes on TiO$_2$.

Additional insight into the photocurrent generation mechanism is provided by the steady state emission spectra of the monolayers and bilayers on TiO$_2$ and ZrO$_2$. See FIGS. 13A, 13B, 13C, and 13D. Upon excitation of MO$_2$-DPPA at 400 nm, intense blue emission is observed from the ZrO$_2$ film but is completely quenched on TiO$_2$. See FIG. 13A. This result is consistent with the energetic scheme in FIG. 8 where the singlet excited state potential for DPPA ($E_{1/2}$=−1.65 V vs NHE) is sufficiently negative for emission quenching by electron transfer to TiO$_2$. Due to the lack of absorption, excitation at energies less than 495 nm does not generate singlet excited DPPA and nominal emission/photocurrent is observed. See FIG. 11. In contrast, for MO$_2$—PtTCPP, strong Q-band absorption below 495 nm generates a triplet excited state but it has insufficient energy ($E_{1/2}$=−0.86 V vs NHE) to undergo electron transfer and thus minimal emission quenching is observed for PtTCPP on TiO$_2$ relative to ZrO$_2$. See FIG. 13B. The small decrease (~10%) in integrated emission intensity from ZrO$_2$—PtTCPP to TiO$_2$—PtTCPP is presumably responsible for the photocurrent observed in FIG. 11 and may be due to at least some 'hot' electron transfer from the singlet excited state of PtTCPP ($E_{1/2}$=−1.15 V vs NHE). Given that the DPPA triplet excited state potential ($E_{1/2}$=−0.5 V vs NHE) is less than that of PtTCPP we do not expect electron transfer from the DPPA triplet state to TiO$_2$.

Upconverted emission from DPPA-Zn-PtTCPP ($\lambda_{ex}$=532 nm) is completely quenched on TiO$_2$. See FIG. 13C. Although the DPPA singlet excited state was generated via TTA-UC, the emission quenching on TiO$_2$ is expected given the excited state electron transfer from DPPA* to the conduction band of TiO$_2$ upon excitation at 400 nm. For the bilayer film on both ZrO$_2$ and TiO$_2$, PtTCPP phosphorescent emission is ~80% quenched, relative to ZrO$_2$—PtTCPP, due to triplet energy transfer to DPPA. See FIG. 14. Equivalent phosphorescent emission intensities from DPPA-Zn—PtTCPP on both TiO$_2$ and ZrO$_2$ (FIG. 13D) indicates there is minimal direct electron transfer from PtTCPP to TiO$_2$.

The above results are consistent with a photocurrent generation mechanism that occurs through low energy light absorption by PtTCPP followed by the generation of a DPPA singlet excited state via TTA-UC, which undergoes charge separation at the TiO$_2$ interface (TiO$_2$-$^1$DPPA TiO$_2$(e$^-$)-DPPA$^+$). To the best of our knowledge this is the first example of directly extracting charge and generating photocurrent from a molecular upconverted state. The photocurrent enhancement in the bilayer film under two sun irradiation (0.21 mA/cm$^2$) is comparable to the best yet achieved for filter/reflection strategies operating under >10 suns. It is important to acknowledge that these are only transient photocurrent measurements and that incorporation of a redox mediator into the electrolyte is necessary to generate sustained current. This work is a crucial proof of concept and a first step towards a TTA-UC solar cell where molecular photon upconversion is directly incorporated into the solar cell architecture.

The above results indicate that the bilayer film is in fact an effective scaffold to facilitate photon upconversion on a metal oxide surface. The strategy can be generalized to any photon upconversion pair. Below we propose several examples of sensitizer and acceptor molecules that could be incorporated into the bilayer architecture. We also propose a scheme where the upconverted photons could be harvested in a dye-sensitized solar cell.

Experimental Section 2.

The co-sensitized bilayer on a metal oxide film (See FIG. 3C) was prepared by first soaking the TiO$_2$ film in a 200 µM solution of DPPA in DMSO for four hours under N$_2$ purging with a break every hour to rinse with MeOH. The DPPA functionalized film (TiO$_2$-DPPA) was then soaked in a 400 µM solution of Zn(CH$_3$COO)$_2$ in MeOH for 10 minutes in the dark. Subsequently, after Zn ion coordination, the film (TiO$_2$-DPPA-Zn) was soaked in a 200 µM solution of PtTCPP in DMSO for 20 minutes under N$_2$ purging, followed by a MeOH rinse, then an additional soak in a 200 µM solution of PdTCPP in DMSO for 22 minutes under N$_2$ purging, followed by a MeOH rinse, to produce the final film (TiO2-DPPA-Zn—PtTCPP/PdTCPP). The absorption spectra of the monolayer acceptor, PtTCPP and PdTCPP bilayer films, and the co-sensitized bilayer film can be seen in FIG. 15.

The cells were irradiated with a two equivalent AM1.5 solar spectrum passed through a 475 nm long pass filter and a shutter programmed to open and close every 10 seconds. See FIG. 16. The peak transient photocurrent from TiO$_2$-DPPA-Zn—PtTCPP/PdTCPP (0.117 mA/cm$^2$) is approximately three times the sum of its parts ($I_{TiO2\text{-}DPPA\text{-}Zn—PtTCPP}$=0.017 mA/cm$^2$ and $I_{TiO2\text{-}DPPA\text{-}Zn—PdTCPP}$=0.019 mA/cm$^2$). The broadband excitation of the Q-bands of each porphyrin in the dual-sensitizer bilayer film increases in overall efficiency of TTA-UC and produces more photocurrent than the bilayers with individual sensitizer at comparable concentration/absorption.

Experimental Section 3.

The trilayer on a metal oxide film (see FIG. 3D) was prepared by first soaking the TiO$_2$ film in a 200 µM solution of DPPA in DMSO for four hours under N$_2$ purging with a break every hour to rinse with MeOH. The DPPA functionalized film (TiO$_2$-DPPA) was then soaked in a 400 µM solution of Zn(CH$_3$COO)$_2$ in MeOH for 10 minutes in the dark. Subsequently, after Zn ion coordination, the film (TiO$_2$-DPPA-Zn) was soaked in a 200 µM solution of PdTCPP in DMSO for 45 minutes under N$_2$ purging, followed by a MeOH rinse. An additional soak in a 400 µM solution of Zn(CH$_3$COO)$_2$ in MeOH for 10 minutes in the dark was performed. The resulting film (TiO$_2$-DPPA-Zn—PdTCPP-Zn) was soaked in a 200 µM solution of PtTCPP in DMSO for 45 minutes under N$_2$ purging, followed by a MeOH rinse, to produce the final film (TiO$_2$-DPPA-Zn—PdTCPP-Zn—PtTCPP). The absorption spectra of the monolayer acceptor, PtTCPP and PdTCPP bilayer films, and trilayer film can be seen in FIG. 17. The trilayer film exhibits low energy absorption that is equal to the sum of the fully loaded bilayer films.

The cells were irradiated with a two equivalent AM1.5 solar spectrum passed through a 475 nm long pass filter and a shutter programmed to open and close every 10 seconds. See FIG. 18. The peak transient photocurrent from TiO$_2$-DPPA-Zn—PdTCPP-Zn—PtTCPP (0.086 mA/cm$^2$) is approximately equal to the sum of its parts ($I_{TiO2-DPPA-Zn—PtTCPP}$=0.039 mA/cm$^2$ and $I_{TiO2-DPPA-Zn—PdTCPP}$=0.045 mA/cm$^2$). The broadband excitation of the Q-bands of each porphyrin in the dual-sensitizer bilayer film increases the overall photocurrent than the bilayers with individual sensitizer at comparable absorption/concentration. The broadband excitation of the Q-bands of each porphyrin in the dual-sensitizer bilayer film increases in overall efficiency of TTA-UC and produces more photocurrent than the bilayers with individual sensitizer at comparable concentration.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A dye-sensitized solar cell comprising:
    a multilayer structure comprising:
      a substrate comprising a metal oxide surface region and a bulk region;
      a self-assembled bilayer film, the bilayer film comprising:
        (a) a monolayer comprising an acceptor molecule covalently bonded to the metal oxide surface, wherein the acceptor molecule comprises a chromophore with an acceptor singlet energy and an acceptor triplet energy, wherein the acceptor singlet energy is greater than or equal to two times the acceptor triplet energy; (b) a linking metal ion bonded to the acceptor molecules; and (c) a sensitizer molecule bonded to the linking metal ion, wherein the sensitizer molecule comprises a chromophore with a sensitizer triplet energy that is greater than the triplet energy of the acceptor molecule.

2. The dye-sensitized solar cell of claim 1, wherein the metal oxide surface region of the substrate comprises a material selected from the group consisting of SiO$_2$, SnO$_2$, TiO$_2$, Nb$_2$O$_5$, SrTiO$_3$, ZnO, Zn$_2$SnO$_4$, ZrO$_2$, NiO, Ta-doped TiO$_2$, Nb-doped TiO$_2$, and any combination thereof.

3. The dye-sensitized solar cell of claim 1, wherein the bulk region of the substrate is conductive, superconductive, ultraconductive, semiconductive, or insulative.

4. The dye-sensitized solar cell of claim 1, wherein the substrate comprises a core-shell nanostructure selected from the group consisting of ZnO-coated SnO$_2$, MgO-coated SnO$_2$, Al$_2$O$_3$-coated SnO$_2$, TiO$_2$-coated In-doped SnO$_2$, and TiO$_2$-coated F-doped SnO$_2$.

5. The dye-sensitized solar cell of claim 1, wherein the metal oxide surface region is in a form selected from the group consisting of nanoparticles, nanocrystals, nanocolumns, nanotubes, nanosheets, nanoscrolls, nanowires, nanotips, nanoflowers, nanohorns, nano-onions, dendritic nanowires, and any combination thereof.

6. The dye-sensitized solar cell of claim 1, wherein the acceptor molecule comprises a polyaromatic hydrocarbon having from three to 20 fused aromatic rings.

7. The dye-sensitized solar cell of claim 6, wherein the acceptor molecule further comprises substituents on the fused aromatic rings, the substituents comprising aromatic rings having from 6 to 20 carbon atoms.

8. The dye-sensitized solar cell of claim 6, wherein the acceptor molecule further comprises substituents on the fused aromatic rings, the substituents selected from the group consisting of alkyl groups having from one to 18 carbon atoms, alkenyl groups having from two to 18 carbon atoms, alkynyl groups having from two to 18 carbon atoms, halogen, amino, amido, and phosphoryl.

9. The dye-sensitized solar cell of claim 6, wherein the acceptor molecule comprises a surface linking group, L, selected from the group consisting of —COOH, —PO$_3$H$_2$, —SO$_3$H, —OPO$_3$H, —OSO$_3$H, —SiO$_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and combinations thereof.

10. The dye-sensitized solar cell of claim 1, wherein the acceptor molecule comprises heteroaromatic rings having from three to fourteen carbon atoms and further comprises a surface linking group, L, selected from the group consisting of —COOH, —PO$_3$H$_2$, —SO$_3$H, —OPO$_3$H, —OSO$_3$H, —SiO$_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and combinations thereof.

11. The dye-sensitized solar cell of claim 6, wherein the linking metal ion is selected from the group consisting of Cu$^{2+}$, Co$^{2+}$, Ni$^{2+}$, Zn$^{2+}$, Mn$^{2+}$, Fe$^{2+}$, Sr$^{2+}$, Al$^{3+}$, V$^{3+}$, In$^{3+}$, Fe$^{3+}$, Gd$^{3+}$, Y$^{3+}$, Yb$^{3+}$, Nd$^{3+}$, Ce$^{3+}$, La$^{3+}$, Sc$^{3+}$, Dy$^{3+}$, Zr$^{4+}$, Ti$^{4+}$, Sn$^{4+}$, and combinations thereof.

12. The dye-sensitized solar cell of claim 6, wherein the sensitizer molecule comprises a coordinated metal ion and a porphine structure or a substituted porphine, wherein the coordinated metal ion is selected from the group consisting of platinum cation (e.g., Pt$^{2+}$), palladium cation (e.g., Pd$^{2+}$), zinc cation (e.g., Zn$^{2+}$), ruthenium cation (e.g., Ru$^{2+}$), lead cation (e.g., Pb$^{2+}$), iridium (e.g., Ir$^{3+}$), and any combination thereof.

13. The dye-sensitized solar cell of claim 6, wherein the sensitizer molecule comprises a coordinated metal ion and a chelating moiety selected from the group consisting of 2-phenylpyridine, 2,2'-bipyridine, 2H-chromen-2-one, boron-dipyrromethene (BODIPY), and any combination thereof, wherein the coordinated metal ion is selected from the group consisting of platinum cation (e.g., Pt$^{2+}$), palladium cation (e.g., Pd$^{2+}$), zinc cation (e.g., Zn$^{2+}$), ruthenium cation (e.g., Ru$^{2+}$), lead cation (e.g., Pb$^{2+}$), iridium (e.g., Ir$^{3+}$), and any combination thereof.

14. The dye-sensitized solar cell of claim 6, wherein the sensitizer molecule is selected from the group consisting of 4,4-difluoro-4-bora-3a,4a-diaza-s-indacene (BODIPY), 9H-thioxanthen-9-one, xanthene, and a buckyball.

15. The dye-sensitized solar cell of claim 1, wherein the acceptor molecule and the sensitizer molecule are selected from among the pairs shown in the following table:

| Acceptor | Sensitizer |
| --- | --- |
| Perylene | PtTPBP |
| 2CBPEA | PtTPBP |
| BD-1 | PtTPBP |
| BD-2 | PtTPBP |
| BDPPA | PtTPBP |
| BODIPY-deriv | PtTPBP |
| BPEA | PtTPBP |
| Perylene | Pt(II)-BODIPY |
| BPEA | PdTPBP |
| Rubrene | PdTPBP |
| Bis-tetracene | PdTPBP |
| Perylene | PdTPBP |
| Perylene | PQ$_4$Pd |
| Perylene | ZnTPBP |
| Perylene-BODIPY dyad | PdTBP |
| Perylene-BODIPY dyad | ZnTPBP |
| Anthracene | [Ru(dmb)$_3$]$^{2+}$ |
| DMA | [Ru(dmb)$_3$]$^{2+}$ |
| DPA | [Ru(dmb)$_3$]$^{2+}$ |
| PPO | Biacetyl |
| Rubrene | PdTAP |
| DPA | PdOEP |
| DPA | PtOEP |
| Rubrene | PdPc(OBu)$_8$ |
| Perylene | ZnTPP |
| C343 | ZnTPP |
| Rubrene | PdPh$_4$Ome$_8$TNP |
| BPEN | PdPh$_4$Ome$_8$TNP |
| PPO | 2MeOTX |
| Pyrene | Ir(ppy)$_3$ |
| Tert-butylpyrene | Ir(ppy)$_3$ |
| 1CBPEA | BODIPY-derivative |
| BPEA | C70 |
| Perylene | C70 |
| DPA | TIHF |
| DPA | Pt1 |
| DPA | Pt2 |
| DPA | [Ru(bpy)$_2$(Phen)-pyrene]$^{2+}$ |
| DPA | [Ru(bpy)$_2$(Phen)ethynyl-pyrene]$^{2+}$ |
| DPA | PtOEP |
| DPA/DPBF | PtOEP |
| DPBF | PtOEP |
| PDI | PyrRuPZn2 |
| PDI | PtTPTNP |
| PDI | H$_2$TPBP |
| Perylene | PPD |
| DPPA | PtCPP |

16. The dye-sensitized solar cell of claim 1, wherein the multilayer structure further comprises:
(d) a second linking metal ion bonded to the first sensitizer molecule; and
(e) a second sensitizer molecule bonded to the second linking metal ion, wherein the second sensitizer molecule comprises a chromophore with a sensitizer triplet energy that is greater than the triplet energy of the acceptor molecules.

17. The dye-sensitized solar cell of claim 1 comprising:
the substrate comprising a zirconium oxide surface region and the bulk region; and
the self-assembled bilayer film comprising: (a) 9,10-bis(4-PO$_3$H$_2$)anthracene bonded to the zirconium oxide surface region; (b) a linking coordinating Zn$^{2+}$ ion bonded to 9,10-bis(4-PO$_3$H$_2$)anthracene; and (c) Pt(II) tetra(carboxyphenyl) porphyrin bonded to the linking coordinating Zn$^{2+}$ ion.

* * * * *